US007880246B2

(12) United States Patent
Hohlfeld et al.

(10) Patent No.: US 7,880,246 B2
(45) Date of Patent: Feb. 1, 2011

(54) MICROSTRUCTURE WITH ENLARGED MASS AND ELECTRODE AREA FOR KINETIC TO ELECTRICAL ENERGY CONVERSION

(75) Inventors: Dennis Hohlfeld, Veldhoven (NL); Martijn Goedbloed, Geldrop (NL)

(73) Assignee: Stichting Imec Nederland, Eindhoven (NL)

( * ) Notice: Subject to any disclaimer, the term of this patent is extended or adjusted under 35 U.S.C. 154(b) by 8 days.

(21) Appl. No.: 12/324,113

(22) Filed: Nov. 26, 2008

(65) Prior Publication Data

US 2009/0140443 A1 Jun. 4, 2009

Related U.S. Application Data

(60) Provisional application No. 60/991,153, filed on Nov. 29, 2007, provisional application No. 61/097,448, filed on Sep. 16, 2008.

(51) Int. Cl.
*H01L 27/14* (2006.01)
(52) U.S. Cl. .................. 257/415; 257/414; 257/417
(58) Field of Classification Search .................. 257/414, 257/415, 417
See application file for complete search history.

(56) References Cited

U.S. PATENT DOCUMENTS

| | | | | |
|---|---|---|---|---|
| 7,562,573 B2* | 7/2009 | Yazdi | ...................... | 73/514.32 |
| 2004/0246654 A1* | 12/2004 | Williams et al. | ............ | 361/278 |
| 2008/0061916 A1* | 3/2008 | Pulskamp | .................. | 336/130 |
| 2009/0002915 A1* | 1/2009 | Ayazi et al. | ................. | 361/287 |

OTHER PUBLICATIONS

Challa, Vinod R., "A vibration energy harvesting device with bidirectional resonance frequency tunability," 2008 Smart Mater. Struct. 17 015035 (10pp).
Chiu, Yi, "MEMS design and fabrication of an electrostatic vibration-to-electricity energy converter," Microsystem Technologies, vol. 13, Issue 11 (2007) pp. 1663-1669.
Despesse, G., "Fabrication and Characterization of High Damping Electrostatic Micro Devices for Vibration Energy Scavenging," Symposium on Design, Test, Integration and Packaging of MEMS/MOEMS (DTIP 2005), Jun. 1-3, Montreux : Switzerland (2005).
Lee, Ki Bang, "A closed-form approach for frequency tunable comb resonators with curved finger contour," Sensors and Actuators—A: Physical, vol. 141, pp. 523-529, 2008.

(Continued)

*Primary Examiner*—Victor A Mandala
(74) *Attorney, Agent, or Firm*—McDonnell Boehnen Hulbert & Berghoff LLP

(57) ABSTRACT

A microstructure has a substrate, a fixed electrode having a plurality of fixed fingers fixed to the substrate, a movable electrode having a body (28) and a plurality of fingers (22) extending from the body, the movable electrode being movable relative to the fixed fingers to vary a capacitance of the electrodes. The fixed fingers (21) extend in a first plane parallel to a main surface of the substrate, wherein the body of the movable electrode extends in a second plane adjacent to the first plane so that the body faces at least some of the plurality of fixed fingers. Such vertical integration can help enable such devices to be made more compact.

9 Claims, 33 Drawing Sheets

OTHER PUBLICATIONS

Leland, Eli S., "Resonance tuning of piezoelectric vibration energy scavenging generators using compressive axial preload," 2006 Smart Mater. Struct. 15 1413-1420.

Morgan, Brian, "Vertically-Shaped Tunable MEMS Resonators," Journal of Microelectromechanical Systems (JMEMS), vol. 17, No. 1, pp. 85-92, 2008.

Scheibner, Dirk, "A Frequency Selective Silicon Vibration Sensor with Direct Electrostatic Stiffness Modulation," Analog Integrated Circuits and Signal Processing, vol. 37, Issue 1 (Oct. 2003), pp. 35-43.

* cited by examiner

MICROSTRUCTURE WITH ENLARGED MASS AND ELECTRODE AREA FOR KINETIC TO ELECTRICAL ENERGY CONVERSION

CROSS-REFERENCE TO RELATED APPLICATIONS

This application claims priority to U.S. Provisional Application Ser. No. 60/991,153 filed Nov. 29, 2007 and U.S. Provisional Application Ser. No. 61/097,448 filed Sep. 16, 2008, the contents of which are incorporated by reference herein in its entirety.

TECHNICAL FIELD OF THE INVENTION

This disclosure relates to microstructures, some used as energy converting devices, such as energy scavengers, based on the conversion of kinetic energy into electrical energy. More particularly it relates to micromachined electrostatic energy converting devices, such as electrostatic scavengers, and to methods for manufacturing such micromachined electrostatic energy converting devices.

BACKGROUND OF THE INVENTION

Future wireless sensor networks will comprise sensor nodes which occupy a volume of typically a few $cm^3$. The scaling down of batteries for powering these sensor nodes faces technological restrictions as well as a loss in storage density. Energy scavengers based on the recuperation of wasted ambient energy are a possible alternative to batteries. Several scavenger concepts have been proposed, based on the conversion of thermal energy, pressure energy or kinetic energy.

Kinetic energy scavengers convert energy in the form of mechanical movement (e.g. in the form of vibrations or random displacements) into electrical energy. For conversion of kinetic energy into electrical energy, different conversion mechanisms may be employed, for example based on piezoelectric, electrostatic or electromagnetic mechanisms. Piezoelectric scavengers employ active materials that generate a charge when mechanically stressed. Electrostatic scavengers utilize the relative movement between electrically isolated charged capacitor plates to generate energy. Electromagnetic scavengers are based on Faraday's law of electromagnetic induction and generate electrical energy from the relative motion between a magnetic flux gradient and a conductor.

Electrostatic energy conversion is based on a variable capacitance structure that is driven by mechanical vibrations and oscillates between a maximum capacitance and a minimum capacitance, thereby converting kinetic energy into electrical energy. In micromachined electrostatic scavengers the relative movement between electrically isolated capacitor plates is obtained by providing a movable electrode and a fixed electrode. The electrodes may have a comb structure comprising an array of fingers, and both electrodes may be interdigitated.

Relative movement between the capacitor plates may comprise changing the overlap area of the fingers (in-plane overlap scavenger) or changing the gap between the fingers (in-plane gap-closing scavenger). The energy output per cycle increases with increasing maximum capacitance (and thus e.g. with increasing size of the electrodes) and is proportional to the mass of the oscillating structure. Therefore, maximizing the mass of the system is an important design consideration. For example, a suspended mass acting as a seismic mass may be connected to the movable electrode.

In prior art in-plane gap-closing devices, e.g. as described by G. Despesse et al. in "Fabrication and characterization of high damping electrostatic micro devices for vibration energy scavenging", Design, Test, Integration and Packaging of MEMS and MOEMS, 2005, the fingers of the movable electrode are horizontally connected to the suspended mass, meaning that they lay substantially in the same plane as the mass. Both the interdigitated electrodes and the suspended mass are for example made from the same functional silicon layer of an SOI substrate. As the seismic mass occupies a given space, e.g. determined by the designated resonance frequency, the electrodes can only be enlarged to cover the residual area of the die. Therefore, for such a device, there is a need for making a trade-off between the size of the seismic mass and the size of the electrodes. Additionally the length of the electrode fingers can not exceed a certain value, as set by structural stability requirements.

In "MEMS design and fabrication of an electrostatic vibration-to-electricity energy converter", Microsystem Technologies, Vol.13, pp 1663-1669, 2007, Y. Chiu et al. present an in-plane gap-closing electrostatic scavenger wherein the seismic mass is increased by providing an externally attached mass (a steel ball). The addition of a separate mass increases the effective mass considerably. This leads to the desired operation at low frequencies (<100 Hz). However, also in this design a trade-off is made between the space needed for attaching the externally attached mass and the size of the electrodes. Moreover, the center of the external mass is located at a relatively large distance above the plane of the actual silicon structure. Therefore, in-plane vibrations may lead to a torque moment acting on the supporting silicon microstructure, which may lead to undesired contact between the movable and the fixed silicon electrodes. Furthermore, by adding the separate mass the compactness and thus the power density of the device are significantly reduced.

A vibration energy scavenger has its maximum power output when input vibrations closely match its resonance frequency, which is influenced by the material properties and the dimensions of the scavenger's parts. The fabrication of micromachined energy scavengers may lead to differences in their mechanical characteristics and thus their resonance frequency. Furthermore the dominant ambient vibration frequency may shift over time. The vibration energy scavenger structure may stay out of resonance when the input vibration frequency changes, resulting in very low power generation or no power generation at all. Therefore, it would be advantageous to have vibration energy scavenger with a tunable resonance frequency.

In "Resonance tuning of piezoelectric vibration energy scavenging generators using compressive axial preload", Smart Materials and Structures 15, 2006, 1413-1420, Leland et al describe a method wherein axial forces are applied on the suspension of a macroscopic double-clamped beam for changing the effective stiffness of an oscillating structure. In this approach, a simply supported piezoelectric bimorph is used as an active element, with a proof mass mounted at the bimorph's center. A variable compressive axial preload is applied to the bimorph, reducing its stiffness and thus the resonance frequency of the device. This approach uses an externally applied force. Furthermore, it may be difficult to fabricate the system proposed by means of micromachining methods.

In V. R. Challa et al, "A vibration energy harvesting device with bidirectional resonance frequency tenability", Smart Materials and Structures 17, p. 015035, 2008 a magnetic force is used to alter the overall stiffness and thus the resonance frequency of an energy harvesting device. Resonance frequency tuning is based on adjusting the position of permanent magnets. The position of the magnets is controlled externally. Resonance frequency tuning of a MEMS resonator using this approach may be unfeasible.

Resonance frequency tuning of oscillating structures is used in various MEMS resonators. More in particular, for resonators based on a comb structure (comprising interdigitated fingers) methods for post-fabrication resonance frequency tuning have been proposed. For example, in "A closed-form approach for frequency tunable comb resonators with curved finger contour", Sensors and Actuators A 141, p 523-529, 2008, K. B. Lee et al describe frequency tunable resonators with curved finger contours. However, fabricating the ideal design is not easy and it may require a lot of space. In "Vertically-shaped tunable MEMS resonators", Journal of Microelectromechanical Systems, Vol 17, No 1, p. 85, 2008, B. Morgan et al describe a tunable MEMS resonator with vertically-shaped comb fingers. However, for fabricating such structures gray scale lithography is needed. In "A frequency selective silicon vibration sensor with direct electrostatic stiffness modulation", Analog Integrated Circuits and Signal Processing, 37, pp 35-43, 2003, D. Scheibner et al describe MEMS comb resonator wherein electrostatic resonance tuning is implemented by a comb system with a linearly varying finger length.

SUMMARY OF THE INVENTION

At least some of the embodiments of the present disclosure to provide a compact micromachined device for electrostatic conversion of kinetic energy into electrical energy, such as e.g. a micromachined electrostatic scavenger, wherein the energy output per cycle may be maximized with less need for making a trade-off between the size of the seismic mass and the size of the electrodes. The present application provides a microstructure as set out in the claims. Some embodiments involve providing a microstructure for kinetic to electrical energy conversion wherein a seismic mass and comb electrodes are vertically integrated. The fingers of the movable electrode are vertically connected to the seismic mass such that the seismic mass is located out of the plane of the electrodes. Because of the vertical integration, the whole die area can be used for forming the electrodes. For a given die size this leads to a bigger electrode area as compared to prior art solutions, and thus to a higher power output. In addition the seismic mass may occupy the whole die area, thus leading to a bigger mass than in prior art solutions or leading to a more compact device than in prior art solutions. With a bigger mass, higher conversion efficiencies may be obtained and lower operating frequencies are enabled, e.g. operating frequencies corresponding to typical ambient vibrations (e.g. frequencies in the range between 50 Hz and 350 Hz).

Methods for manufacturing such a microstructure are described, wherein the seismic mass and the electrodes are vertically integrated.

Some of the present embodiments also provide a method for tuning a resonance frequency of a micromachined device for electrostatic conversion of kinetic energy into electrical energy. This is achieved by providing at least one tuning actuator, wherein the at least one tuning actuator is vertically integrated with the seismic mass. With such vertical integration a plurality of tuning actuators can be provided such that a good tuning efficiency can be obtained, the tuning efficiency being defined as the shift in resonance frequency as a function of a tuning voltage applied to the tuning actuator.

In some embodiments a microstructure comprises a fixed electrode with a plurality of fixed fingers fixed to a substrate, a movable electrode having a body and a plurality of movable fingers extending from the body, the movable electrode being movable relative to the fixed fingers to vary a capacitance of the electrodes. In a preferred embodiment, the plurality of fixed fingers and the plurality of movable fingers may be interdigitated. The plurality of fixed fingers extends in a first plane parallel to a main surface of the substrate. The movable electrode has a body in the form of a means for physically connecting the plurality of movable fingers located in a second plane adjacent to the first plane. The means for physically connecting the plurality of movable fingers are vertically integrated with the plurality of fingers. The plurality of fixed fingers may extend from an edge of the microstructure to an opposite edge of the microstructure. The plurality of fixed fingers may be suspended between fixation structures anchored to the substrate. The means for physically connecting the movable fingers may comprise a seismic mass.

A microstructure as described herein may be used in devices wherein electrostatic conversion between kinetic energy and electrical energy occurs, such as for example electrostatic energy scavengers or accelerometers.

In some embodiments a microstructure of may comprise means for tuning a resonance frequency of the microstructure. The means for tuning a resonance frequency of the microstructure may comprise at least one electrostatic tuning actuator. It may comprise a plurality of electrostatic tuning actuators. The at least one electrostatic tuning actuator may comprise a plurality of fixed tuning fingers having a varying length, e.g. a linearly varying length, and a plurality of movable tuning fingers wherein the plurality of movable tuning fingers are movable relative to the plurality of fixed tuning fingers. The plurality of movable tuning fingers and the plurality of fixed tuning fingers may be interdigitated. The means for tuning the resonance frequency may be vertically integrated with the body of the movable electrode. For example, the means for tuning the resonance frequency may extend in the first plane.

A method for manufacturing a microstructure can be as set out in the claims. It may comprise providing on a substrate a plurality of beam-shaped elements for forming fingers of a movable electrode; providing in a first plane parallel to a main surface of the substrate a plurality of second beam-shaped elements for forming a plurality of fixed fingers, a height of the plurality of second beam-shaped elements being smaller than a height of the plurality of first beam-shaped elements; providing in a second plane adjacent to the first plane a body to physically connect the plurality of first beam-shaped elements; and releasing the plurality of first beam-shaped elements and the body to make them movable relative to the plurality of second beam-shaped elements.

In an embodiment of a manufacturing method, the substrate can be an SOI substrate comprising a handling layer, an intermediate silicon oxide layer and a functional silicon layer. Providing a plurality of first beam-shaped elements on the substrate may comprise forming the plurality of first beam-shaped elements in the functional silicon layer by etching through the functional silicon layer. Providing a plurality of second beam-shaped elements may comprise forming the plurality of second beam-shaped elements in the functional silicon layer by etching through the functional silicon layer. The plurality of second beam-shaped elements may be partly etched for reducing their height. Furthermore, providing the body may comprise bonding a capping wafer to the plurality of first beam-shaped elements, e.g. wafer bonding a capping wafer or e.g. bonding a capping wafer by means of thermo-compression. Releasing the plurality of first beam-shaped elements may comprise removing the intermediate silicon oxide layer between the handling layer and the plurality of first beam-shaped elements and releasing the body may comprise structuring the body by etching.

In a second embodiment of a manufacturing method, the substrate may be for example a silicon substrate or any other substrate suitable for manufacturing a microstructure as described herein. In this embodiment, providing on the substrate a plurality of first beam-shaped elements comprises: providing on the substrate a plurality of shallow beam-shaped features at locations where the plurality of first beam-shaped elements are to be formed; bonding a capping wafer to the substrate; and forming the plurality of first beam-shaped elements in the capping wafer where the shallow beam-shaped features are located, by etching through the capping wafer. Providing the plurality of second beam-shaped elements may comprise forming the plurality of second beam-shaped elements in the capping wafer by etching through the capping wafer. Providing the body may comprise using the substrate or part of the substrate as a body. Releasing the plurality of first beam-shaped elements and releasing the body may comprise etching through the substrate.

The embodiments disclosed, however, both as to organization and method of operation, together with features and advantages thereof, may best be understood by reference to the following detailed description when read with the accompanying drawings.

BRIEF DESCRIPTION OF THE DRAWINGS

FIG. 1 is a schematic representation of a prior art gap-closing electrostatic scavenger.

FIG. 3 is a schematic representation of a gap-closing electrostatic scavenger according to a present embodiment.

In FIGS. 4(a) to 4(l) the top drawing shows a top view of the structure and the bottom drawing shows a cross section along line A-A'. In FIGS. 4(m) and 4(n) the top drawing shows a bottom view of the structure and the bottom drawing shows a cross section along line A-A'.

FIG. 16 shows simulation results.

DETAILED DESCRIPTION

A number of the disclosed embodiments involve a design and/or a manufacturing method for a compact microstructure that is suitable for electrostatic conversion of kinetic energy into electrical energy. Such a microstructure may be used in devices wherein electrostatic conversion between kinetic energy and electrical energy occurs, such as for example in micromachined electrostatic energy scavengers or accelerometers. Some embodiments further involve a method for tuning a resonance frequency of such a microstructure. In this description, the design and the manufacturing methods of the microstructure are described for a gap-closing electrostatic energy scavenger configuration. However, the microstructure may be used in other energy converting devices.

Figure 1A:
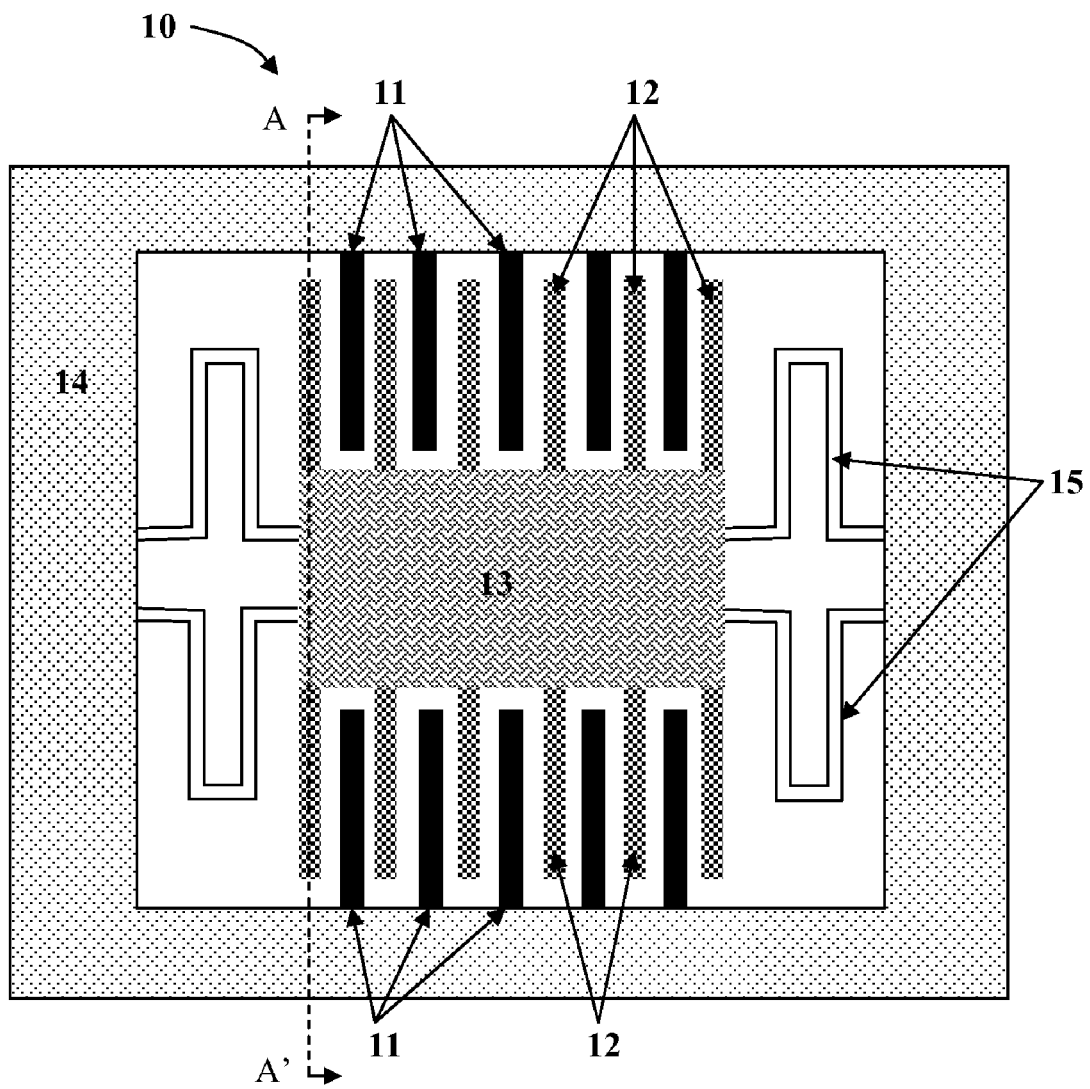
FIG. 1(a) shows a top view.
Figure 2A:
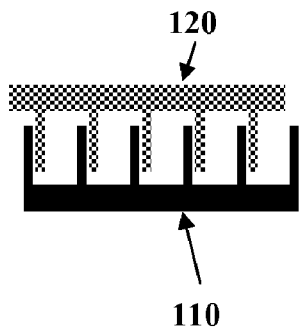
FIG. 2 illustrates the cycle of an electrostatic energy scavenging process with a variable capacitor: (a) charging the variable capacitor from a voltage source at maximum capacitance position, (b) decreasing the capacitance while keeping the charge constant and at minimum capacitance position transferring the charge of the variable capacitor to a storage capacitor, (c) increasing the capacitance to its maximum value.
Figure 2B:
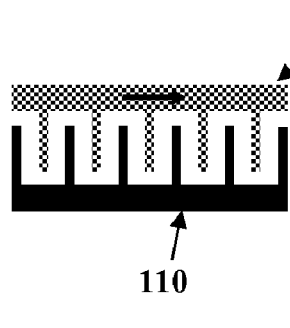

FIG. 1(a) schematically shows a prior art gap-closing electrostatic scavenger 10. The energy scavenging principle of such a gap-closing electrostatic scavenger 10 is based on using vibrational energy to charge a storage capacitor, by means of a variable capacitor. The variable capacitor is formed between fixed capacitor plates and movable capacitor plates, e.g. between the sidewalls of fixed fingers 11 and movable fingers 12 which may for example be fabricated by anisotropically dry etching of silicon. The fixed fingers 11 can be physically connected to a frame 14. The movable fingers 12 may be physically connected to a seismic mass 13. The movable elements (movable fingers 12 and seismic mass 13) may be physically connected to the frame 14 by means of suspension elements 15. The spacing between the fixed capacitor plates or fixed fingers 11 and the movable capacitor plates or movable fingers 12 changes with displacement of the seismic mass 13 connected to the movable plates. The oscillatory motion of the seismic mass 13 is thus used to vary the capacitance of the variable capacitor. The cycle for energy conversion comprises four phases (illustrated in FIG. 2, showing a movable electrode 120 and a fixed electrode 110):

Phase 1: The movable electrode structure 120 (e.g. connected to a seismic mass) moves from its center to the maximum displacement position. Here, the capacitance is at its maximum (FIG. 2(a): velocity=0; $C_{MEMS}=C_{max}$).

Phase 2: In this position (FIG. 2(a)) the variable capacitor is charged from an external voltage source.

Phase 3: In isolated state the movable electrode 120 connected to the mass moves back to the center position in which the capacitance is at its minimum value (FIG. 2(b)). As the charge remains constant the capacitor voltage increases.

Phase 4: At minimum capacitance position (FIG. 2(b), max velocity, $C_{MEMS}=C_{min}$), the charge is shared with or transferred to a storage capacitor.

Figure 2C:
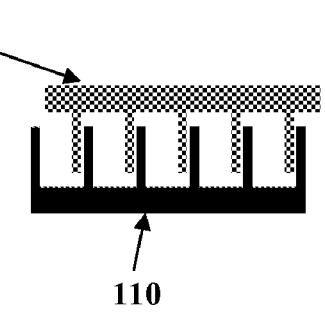

From here on the steps are performed in opposite direction (FIG. 2(c)). Within one vibration period the variable capacitor is charged and discharged two times.

Figure 1B:
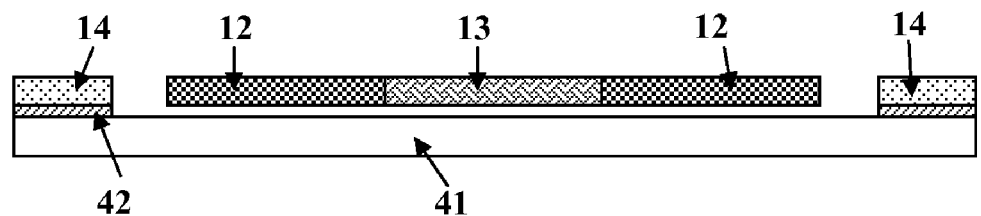
FIG. 1(b) shows a cross section along line A-A'.

In prior art designs of micromachined electrostatic scavengers 10, as illustrated in FIG. 1, a seismic mass 13 is fabricated in the same step from the same functional material as the electrodes or capacitor plates, e.g. from the functional silicon layer of an SOI substrate with handling layer 41 and intermediate oxide layer 42. This means that the seismic mass 13 and the electrodes are integrated horizontally, as shown in FIG. 1(b): the fingers 12 of the movable electrode are horizontally connected to the seismic mass 13, meaning that they lay substantially in the same plane, thus leading to a trade-off to be made between mass size and electrode area. In some prior art designs an external mass is provided (e.g. as reported by Y. Chiu et al. in "MEMS design and fabrication of an electrostatic vibration-to-electricity energy converter", Microsystem Technologies, Vol. 13, pp 1663-1669, 2007), thus increasing the mass but leading to a less compact design and thus a lower power density.

Figure 3A:
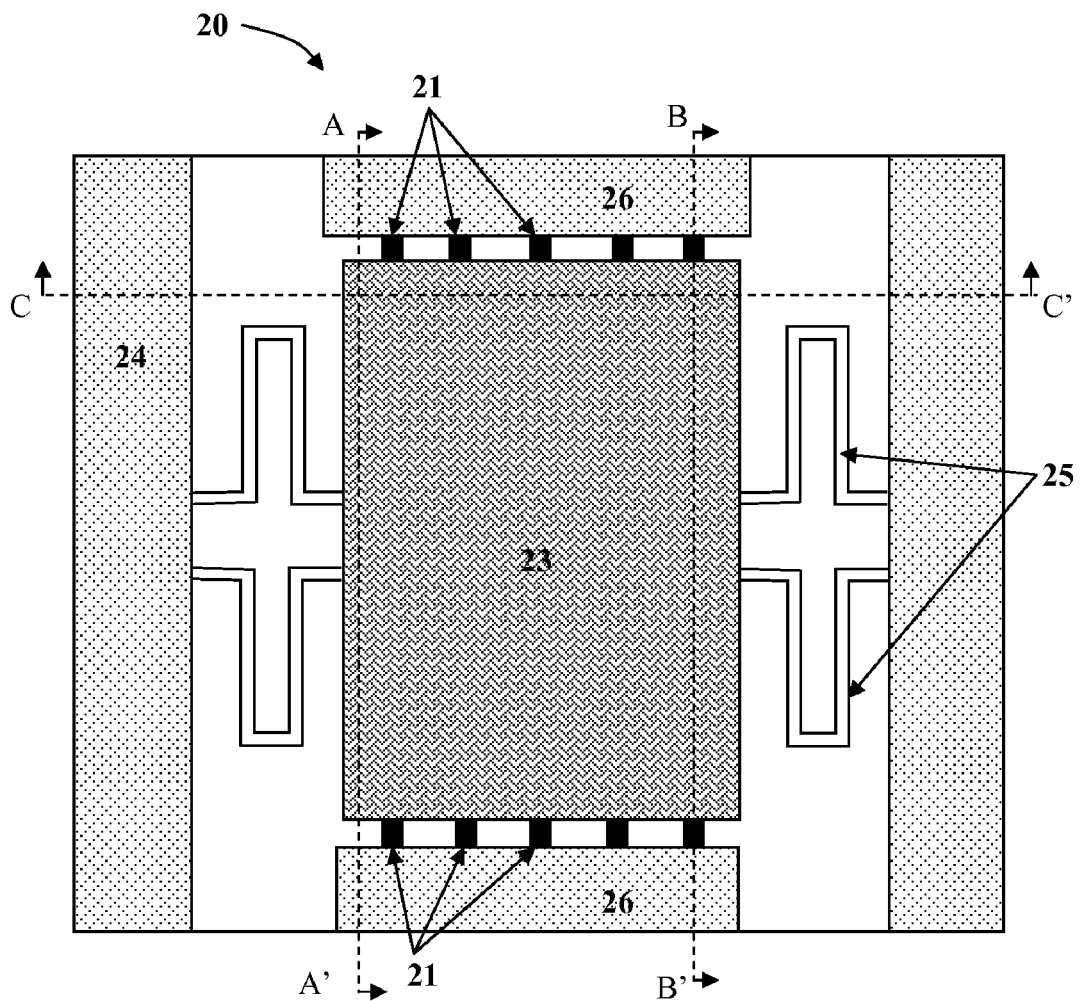
FIG. 3(a) shows a top view.
Figure 3B:
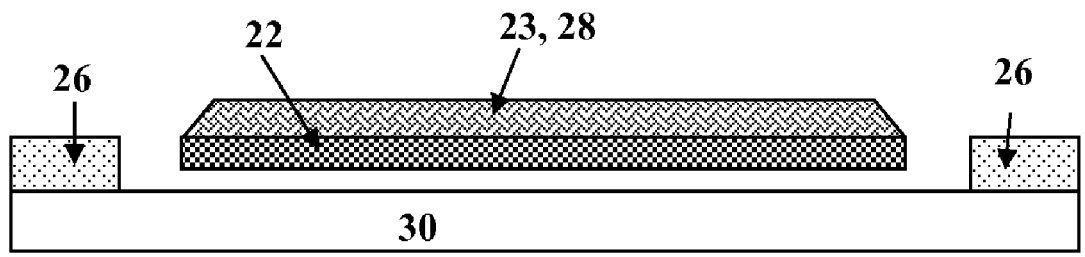
FIG. 3(b) shows a cross section along line A-A'.
Figure 3C:
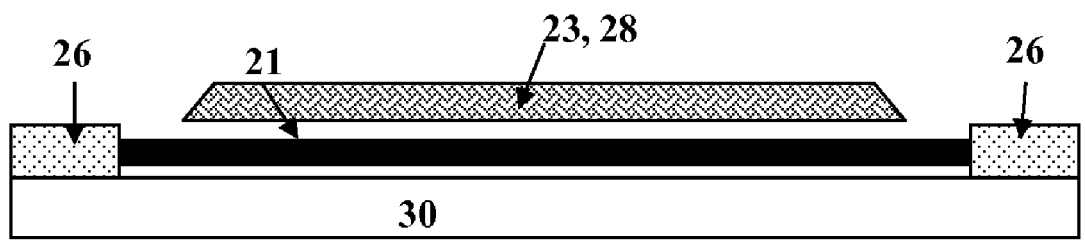
FIG. 3(c) shows a cross section along line B-B'.
Figure 3D:
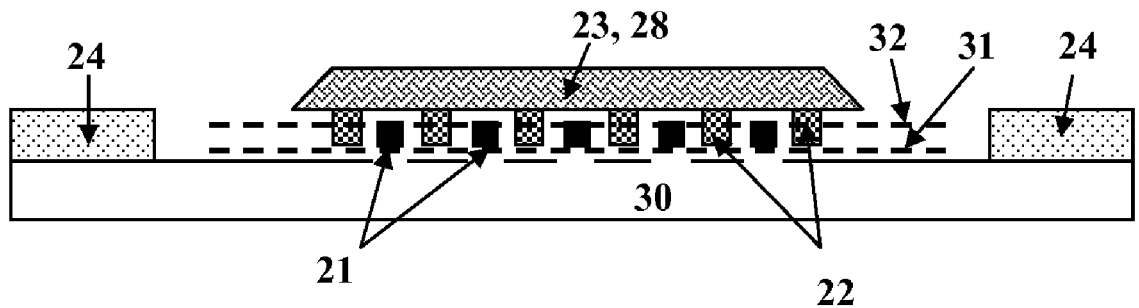
FIG. 3(d) shows a cross section along line C-C'.

A design of a micromachined electrostatic scavenger 20 according to embodiments disclosed herein, shown in FIGS. 3(a) to 3(d), can ameliorate or overcome these limitations by vertically integrating the seismic mass 23 and the electrodes; the movable fingers 22 of the movable electrode are vertically connected to the seismic mass 23. This can be seen in FIG. 3(b), showing a cross section of the electrostatic scavenger 20 along a line A-A' shown in FIG. 3(a) and in FIG. 3(d), showing a cross section of the electrostatic scavenger 20 along line C-C' shown in FIG. 3(a). In such a design, a bigger part of the scavenger's footprint can be used for electrode fabrication as compared to prior art designs (FIG. 1). This leads to a bigger electrode area, which increases power output. The seismic mass 23 may occupy the whole die area, thus leading to a bigger mass than in prior art solutions or leading to a more compact device than in prior art solutions. It is an advantage of the bigger mass that a higher conversion efficiency may be obtained and that it enables lower operating frequencies, e.g. operating frequencies corresponding to typical ambient vibrations (e.g. frequencies in the range between 50 Hz and 350 Hz).

As illustrated in FIG. 3, an electrostatic scavenger 20 according to the present embodiment comprises a fixed electrode comprising a plurality of fixed fingers 21, and a movable electrode comprising a plurality of movable fingers 22 and a body 28. The fingers 21 of the fixed electrode and the fingers 22 of the movable electrode are interdigitated. This is illustrated in FIG. 3(d). The fingers 21 of the fixed electrode are attached to fixation structures 26 anchored on a substrate 30, as illustrated in FIG. 3(a) and in the cross section along line B-B' shown in FIG. 3(c). In the embodiment shown in FIG. 3 the fixed fingers 21 are attached to fixation structures 26 at two opposite sides of the scavenger die, such that the fixed fingers extend from one edge of the scavenger die to the opposite edge of the scavenger die (FIG. 3(c)). A body is provided in the form of means 28 for physically connecting the fingers 22 of the movable electrode to each other (FIG. 3(d)). As opposed to prior art designs with means for physically connecting the movable fingers integrated laterally with the movable fingers, in the embodiment of FIG. 3 there is a body in the form of a means 28 for physically connecting the movable fingers 22, wherein the body is integrated vertically with the fingers. The means 28 for physically connecting the movable fingers 22 may comprise the seismic mass 23. Vertical integration of the means 28 for physically connecting the movable fingers 22 is illustrated in FIGS. 3(b), 3(c) and 3(d). The fingers 21 of the fixed electrode are located in a first plane between the plane 31 (represented in FIG. 3(d) by a first dashed line) parallel to the substrate surface and a plane 32 (represented in FIG. 3(d) by a second dashed line) parallel to the substrate surface. Vertical integration means that the means 28 for connecting the movable electrode fingers 22 are located in a second plane adjacent to the first plane and outside the area between the planes 31 and 32. In embodiments described herein, the means 28 for connecting the movable electrodes 22 may comprise or form a seismic mass 23. This mass 23 is thus vertically integrated with the electrode fingers 21, 22; the mass is located outside the area between the plane 31 and the plane 32, and its size can be optimized without the need for making a trade-off between the size of the seismic mass and the size of the electrodes. The movable structure (comprising the body 28 and the movable fingers 22) is laterally connected to fixation structures 24 on the substrate 30 (at opposite sides of the scavenger) by means of suspension elements 25, e.g. by means of folded-beam suspension elements 25 as shown in FIG. 3(a). Vibration of the substrate 30 (and thus the fixation structures 24, 26) results in movement of the seismic mass 23 and the movable electrode comprising movable fingers 22 relative to the fixed electrode comprising fixed fingers 22, such that the distance between the fingers 21 of the fixed electrode and the fingers 22 of the movable electrode changes periodically, resulting in a periodic capacitance change.

In the present embodiment, it is advantageous to make the seismic mass 23 as large as possible. For example, for a die size of 8 mm×8 mm (corresponding to a typical space that may be available for autonomous wireless systems), mass dimensions in the range between 3 mm×3 mm and 6 mm×6 mm may be used, with a height in the range between 400 micrometer and 1000 micrometer, e.g. between 500 micrometer and 800 micrometer, e.g. between 600 micrometer and 700 micrometer. However, other mass dimensions may be used. The width of the fingers 21, 22 may for example be in the range between 10 micrometer and 30 micrometer and their spacing may for example be in the range between 10 micrometer and 50 micrometer.

Figure 4A:
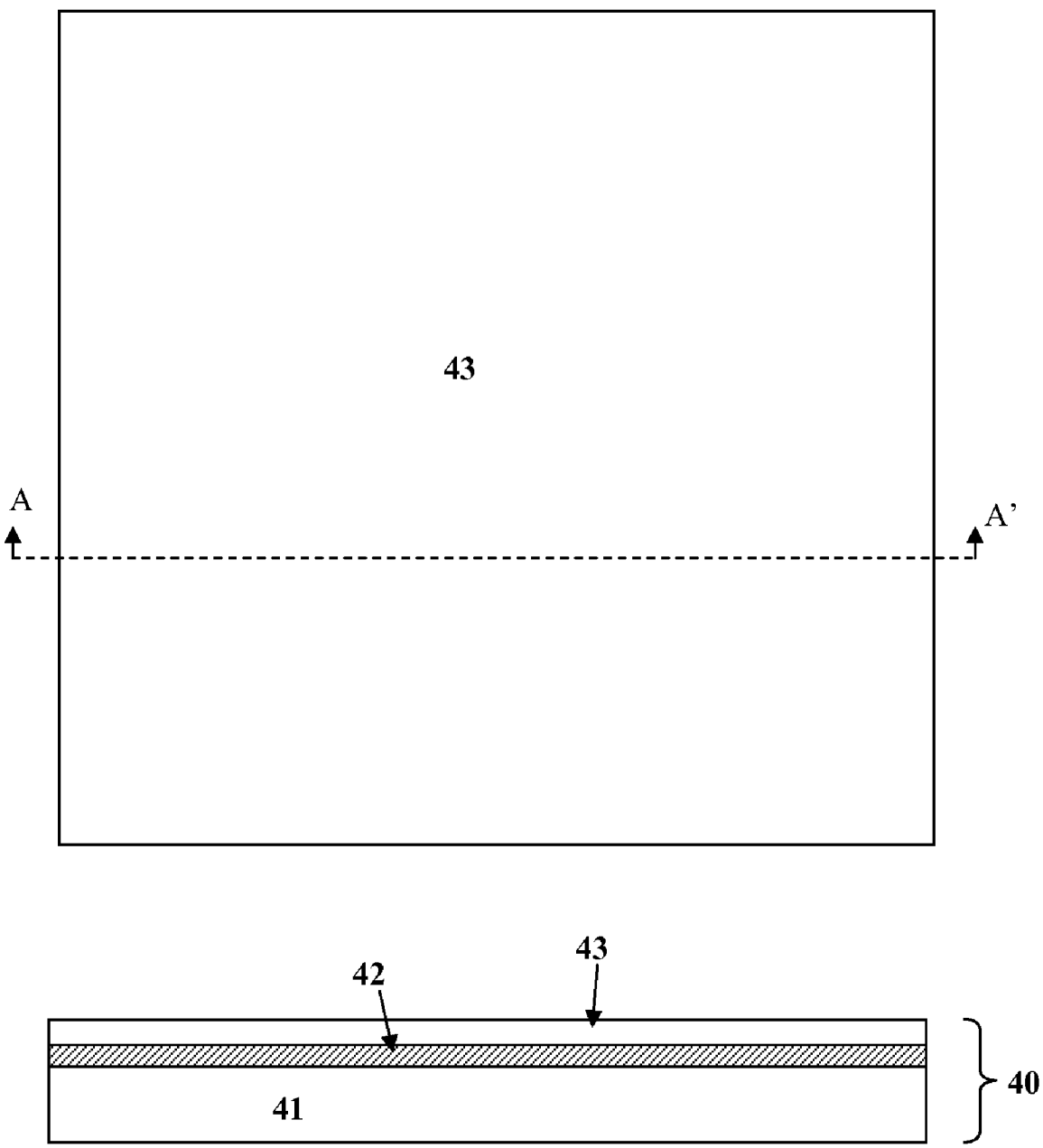
FIGS. 4(a) to 4(n) illustrate a manufacturing process for fabricating an electrostatic energy scavenger of a present embodiment.
Figure 4B:
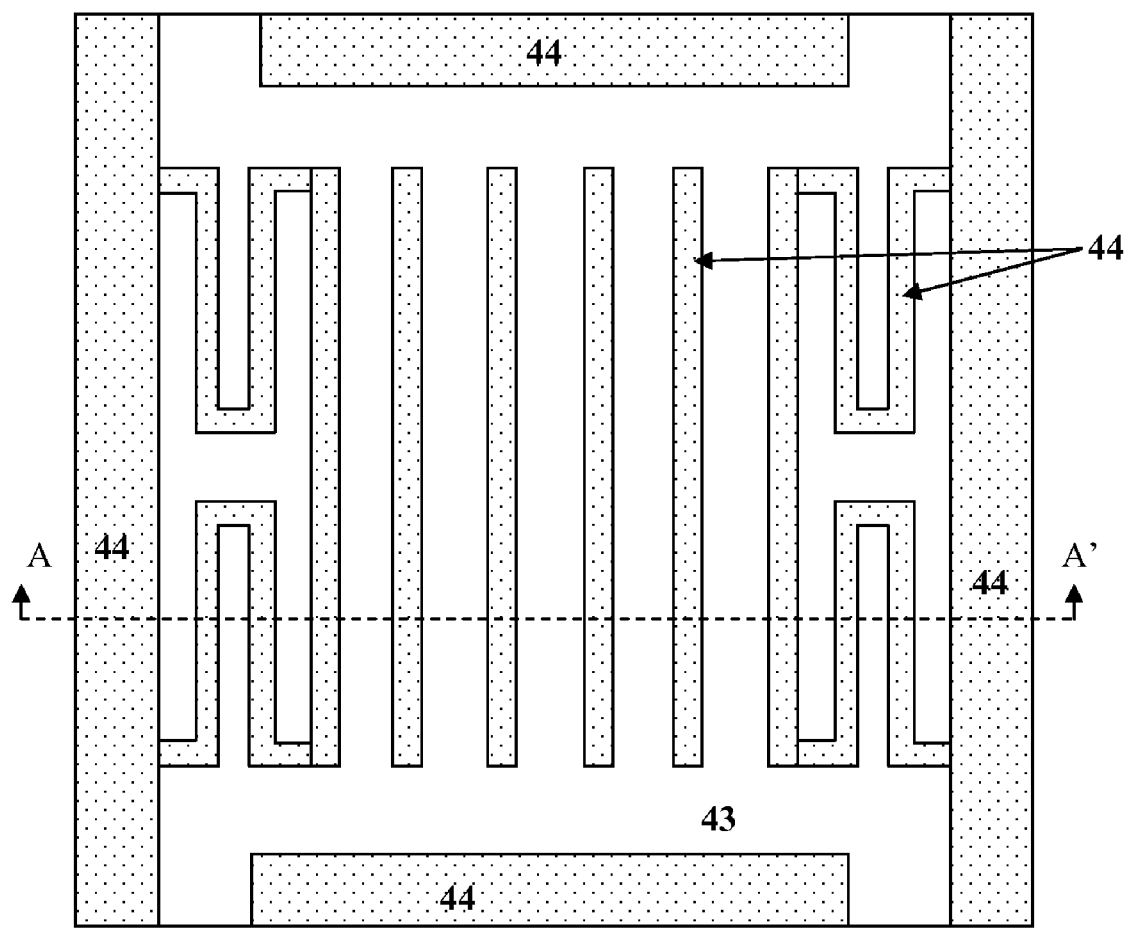
Figure 4B:
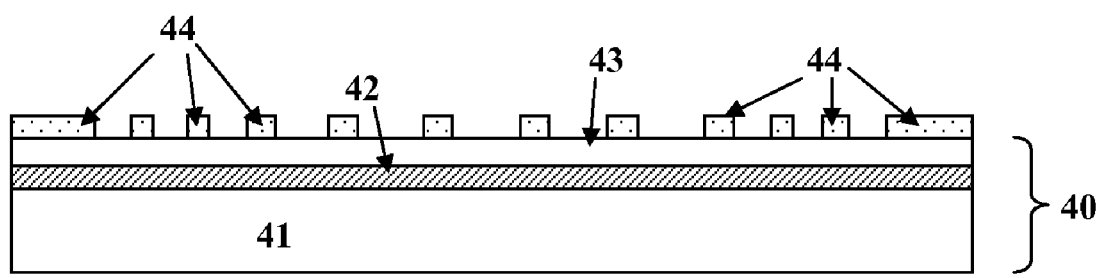
Figure 4C:
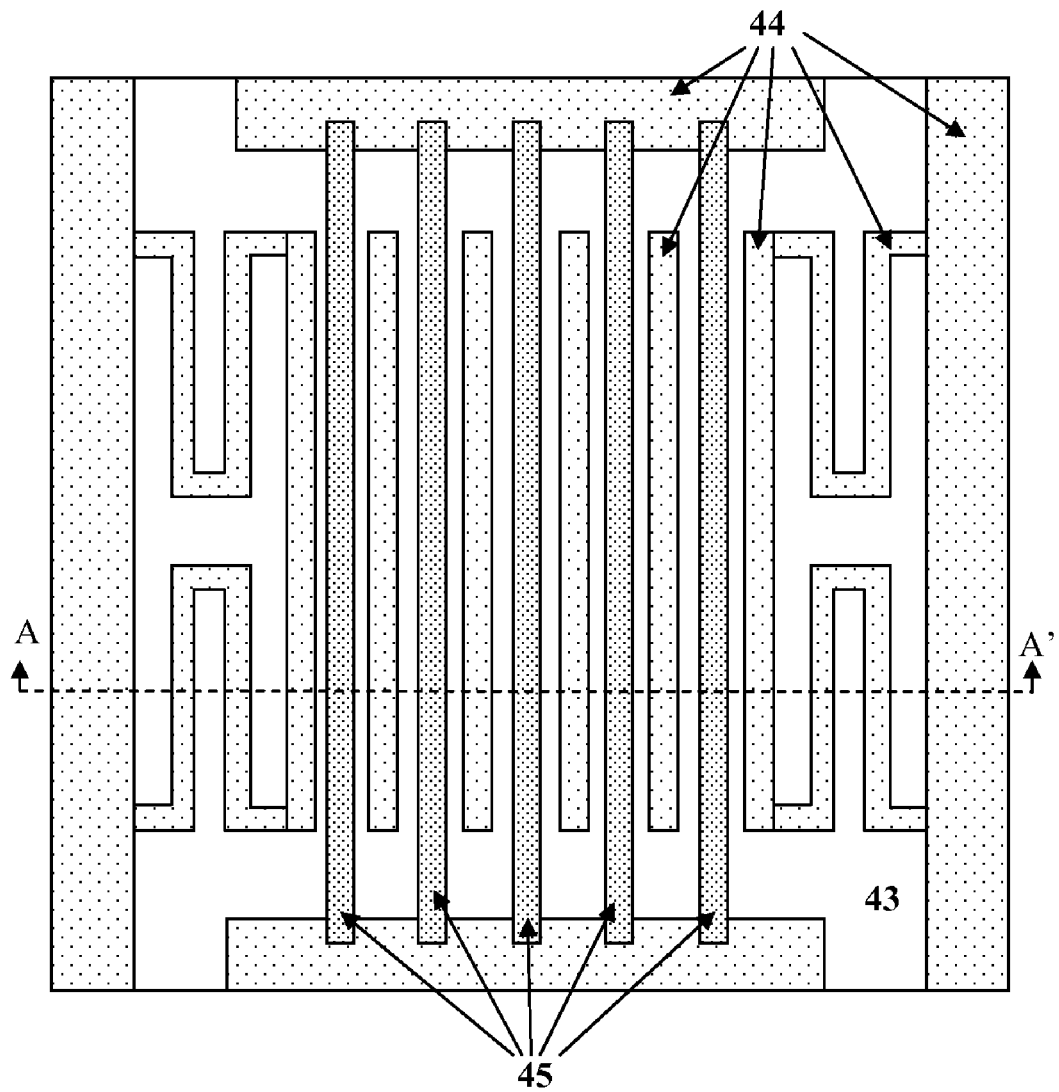
Figure 4C:
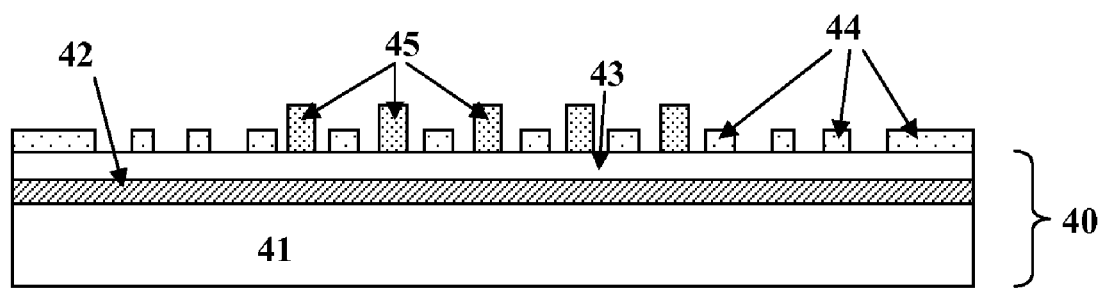
Figure 4D:
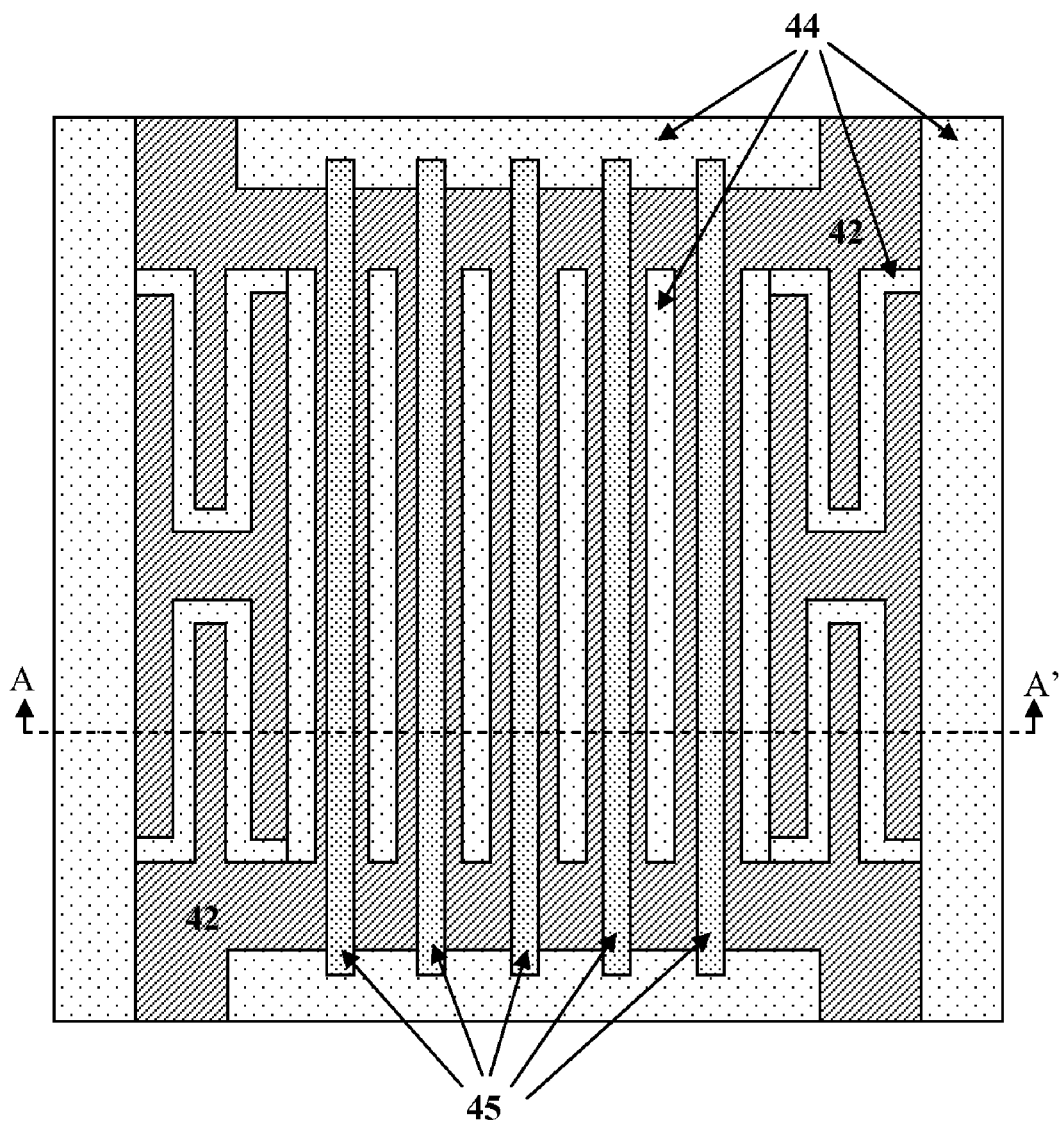
Figure 4D:
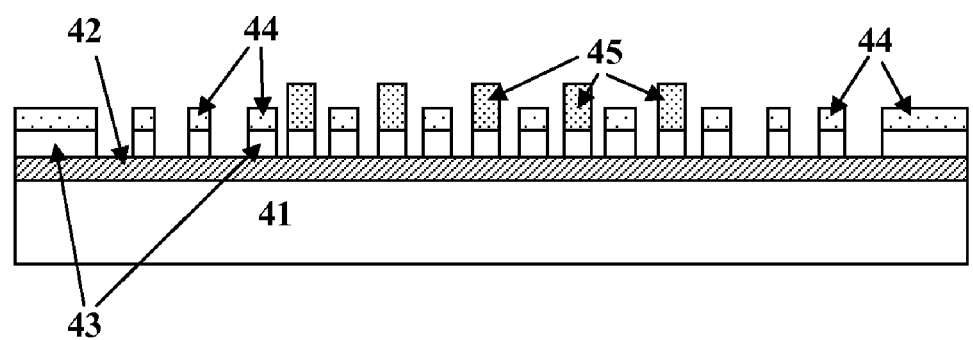
Figure 4E:
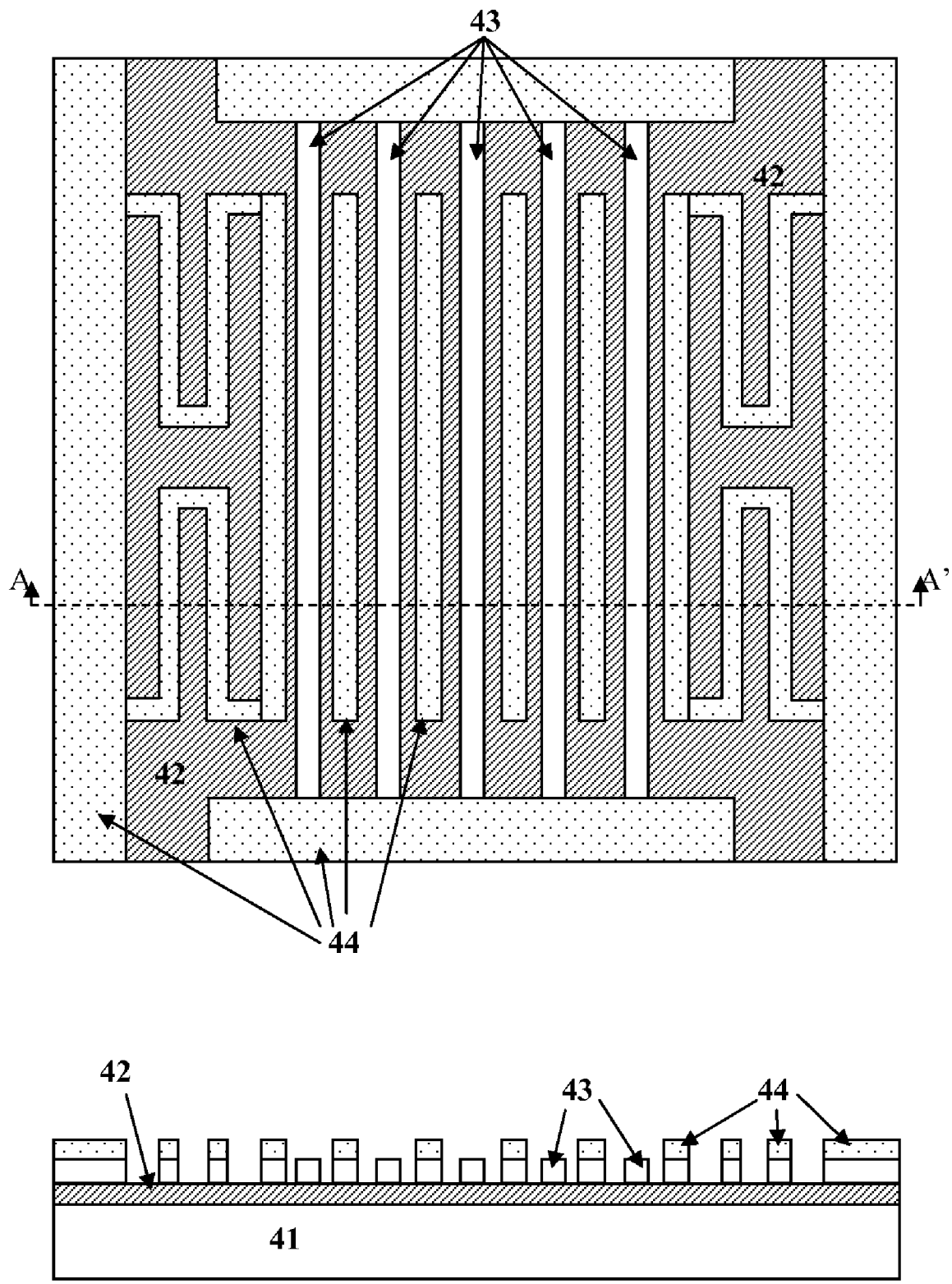
Figure 4F:
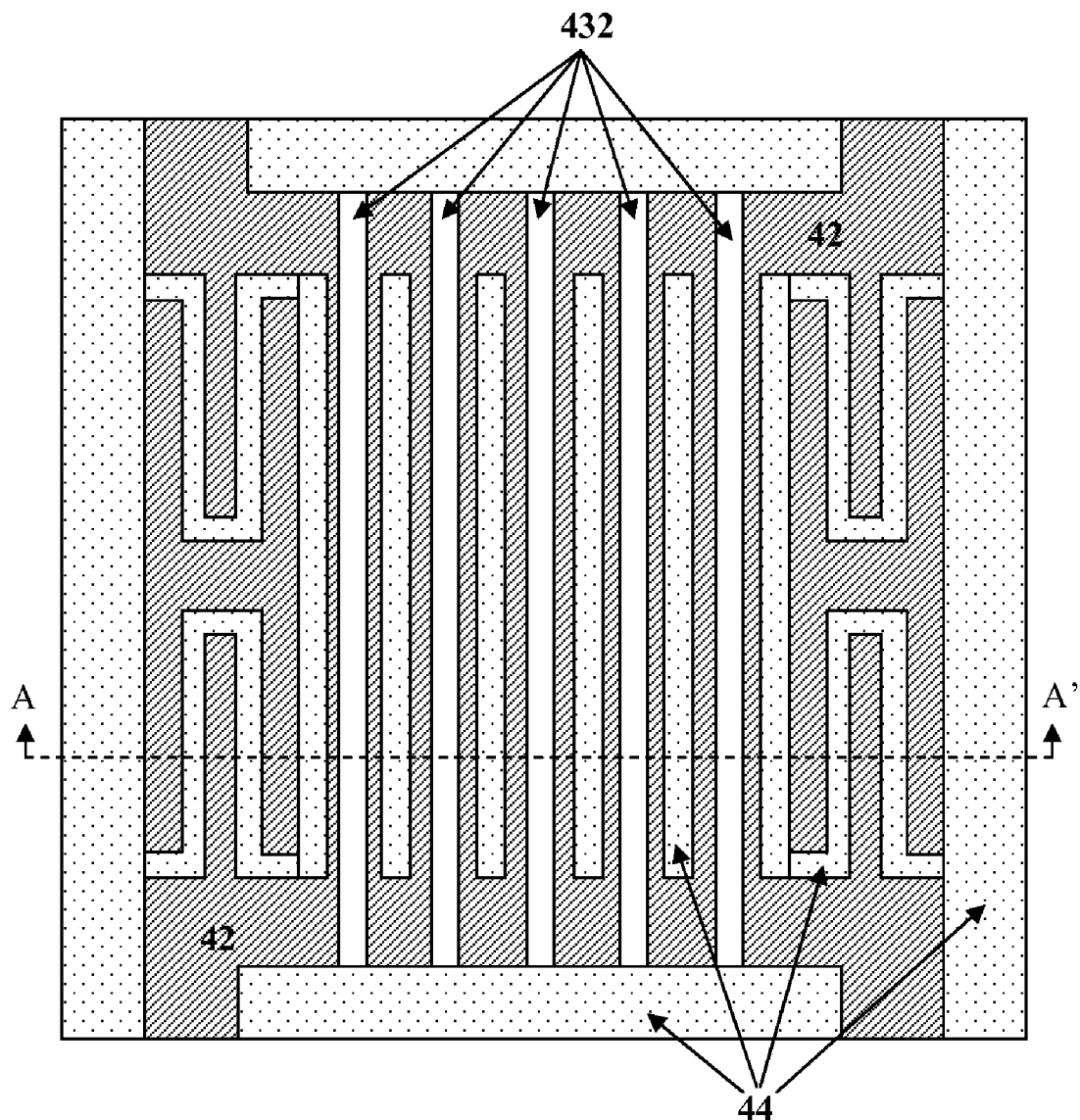
Figure 4F:
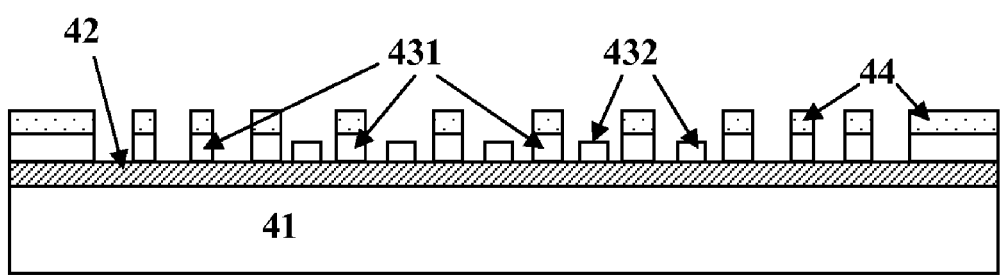
Figure 4G:
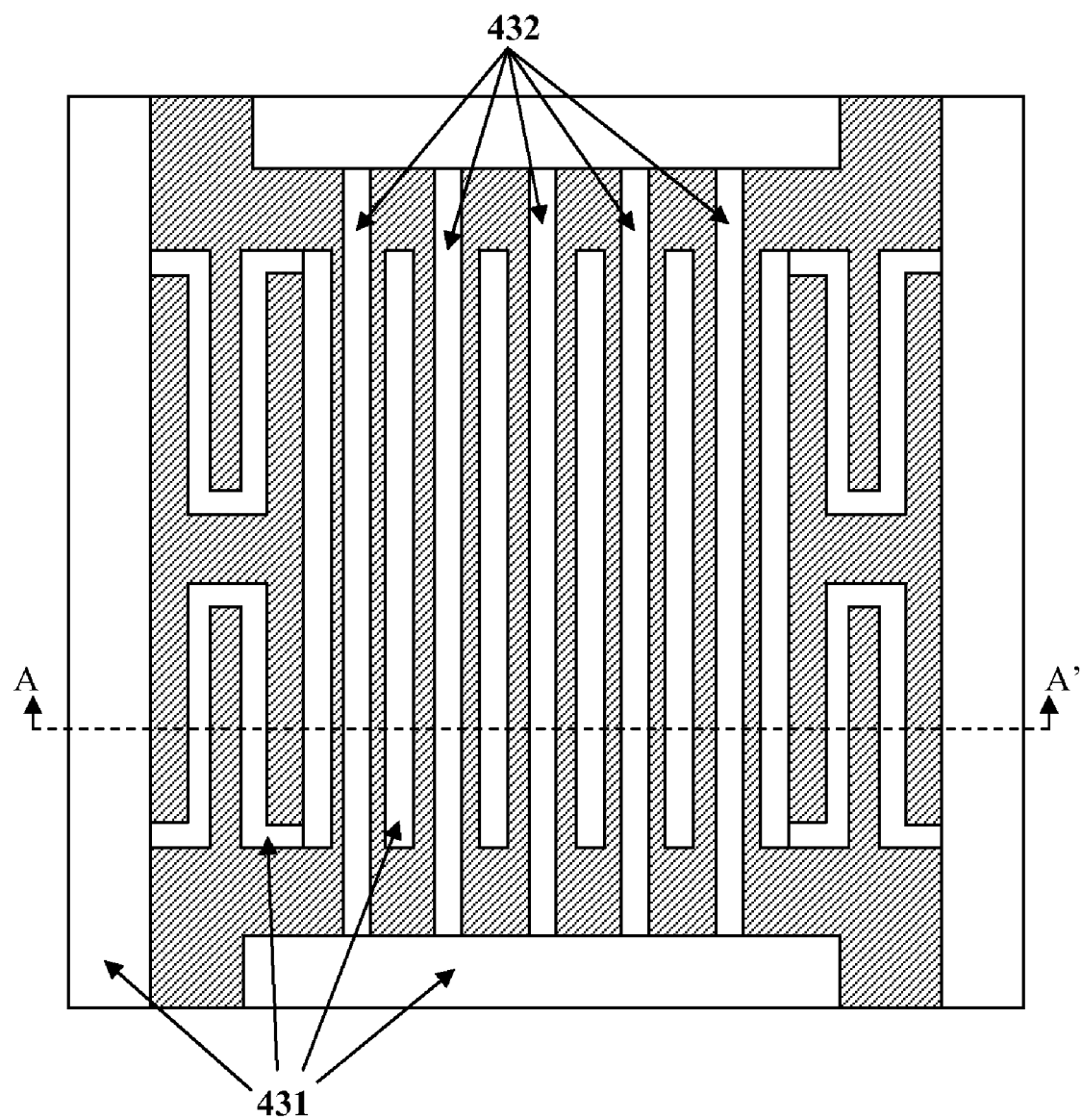
Figure 4G:
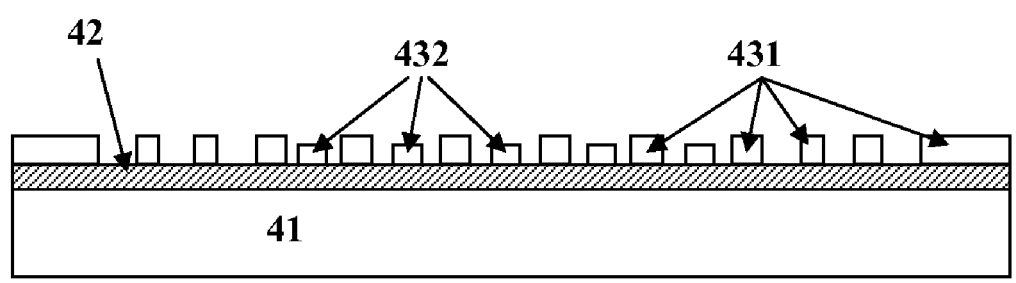
Figure 4H:
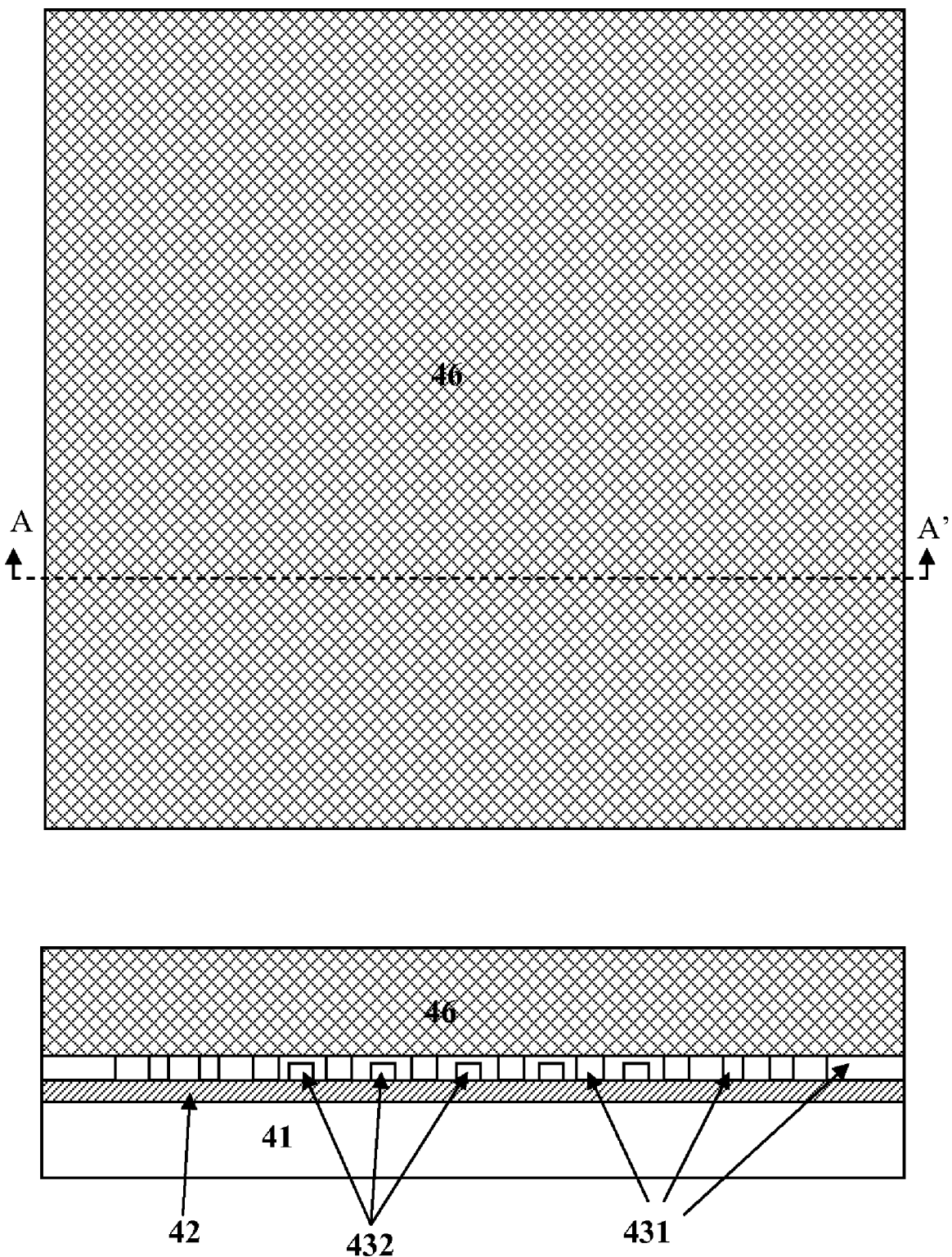
Figure 4I:
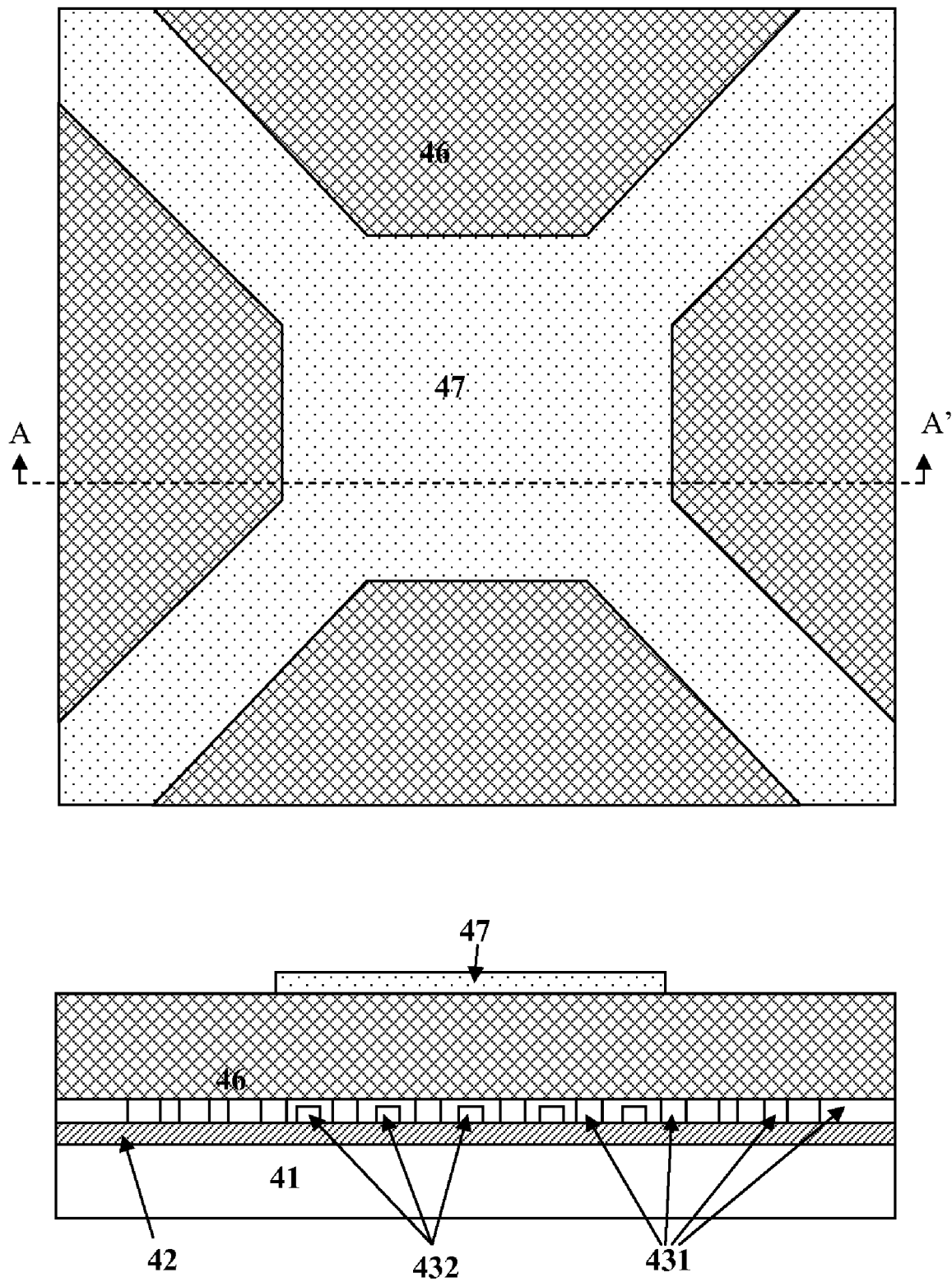
Figure 4J:
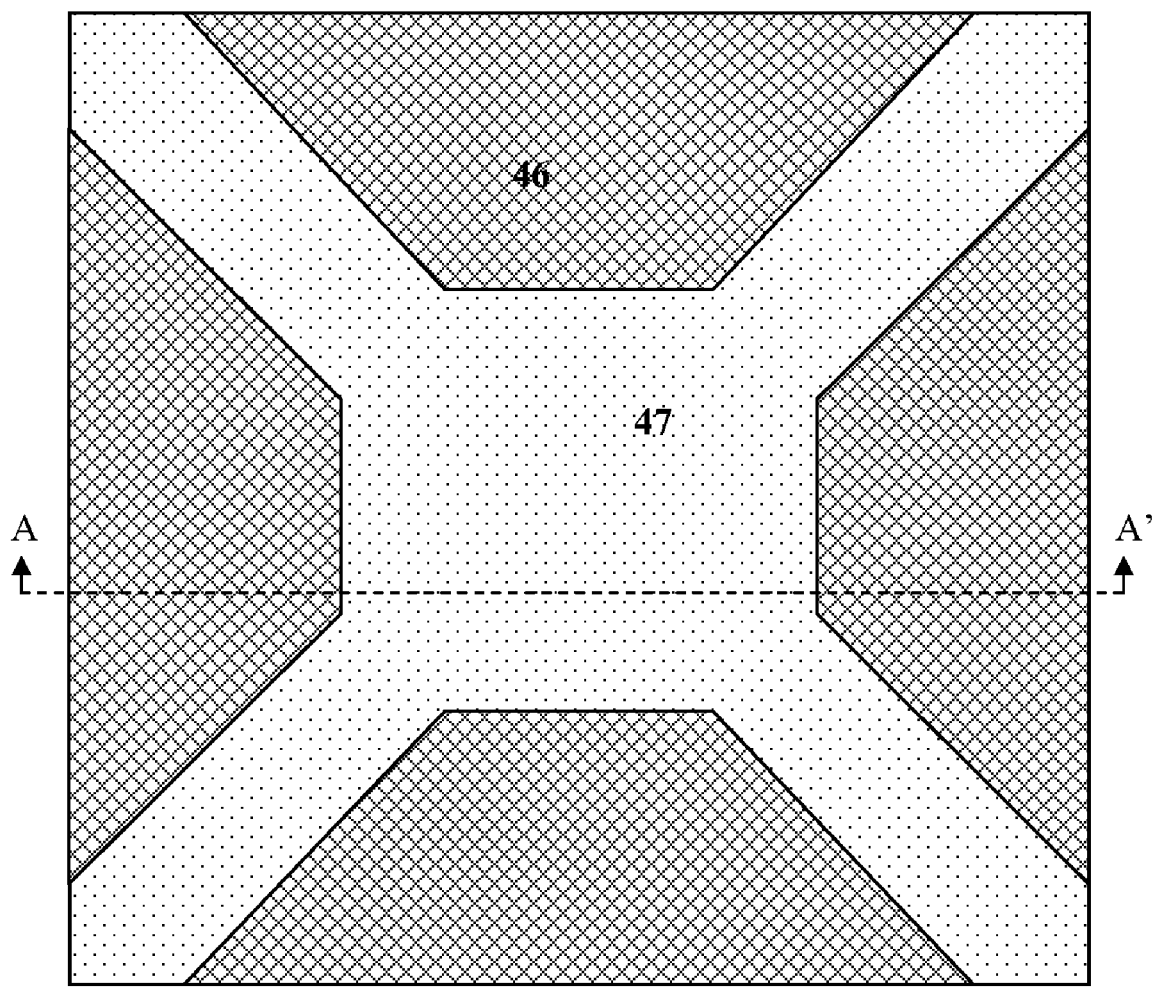
Figure 4J:
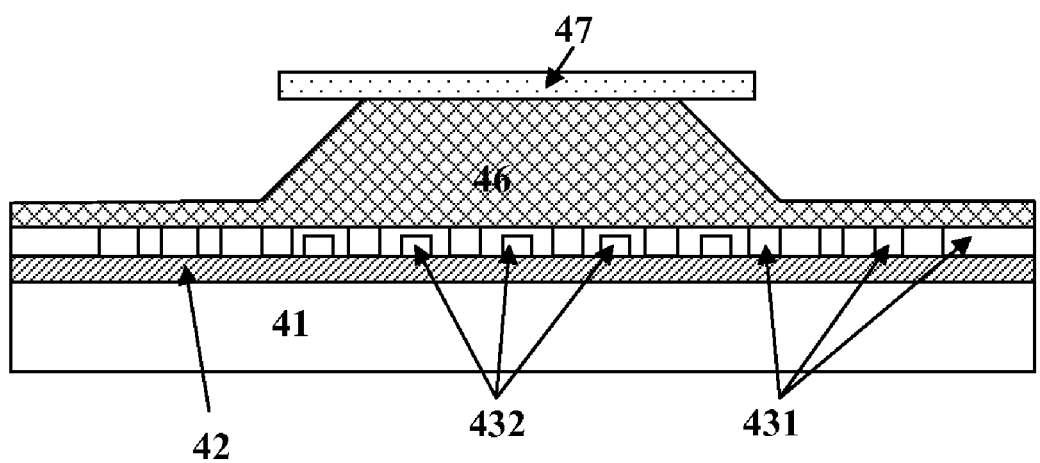

A method for the fabrication of an electrostatic scavenger 20 according to a present embodiment is schematically illustrated in FIGS. 4(a) to 4(l). In each figure, the top part shows a top view of the structure and the bottom part shows a cross section along line A-A'. In the example shown, the fabrication starts with a blank SOI substrate 40 (FIG. 4(a)). Such a substrate 40 comprises a handling layer 41 with a thickness of several 100 µm, an intermediate layer 42 of silicon oxide with a thickness of e.g. 2 µm and a functional layer 43 of silicon with a thickness in the range between 50 µm and 200 µm. Two patterned layers are subsequently applied on the SOI substrate 40. First an oxide layer 44 is provided and patterned (FIG. 4(b)), the oxide pattern corresponding to the locations where the movable fingers 22, the fixation structures 24, 26 and the suspension elements 25 are to be formed. A preferred material for forming layer 44 is an oxide such as a silicon oxide. However, any other suitable material that can be patterned easily and that has a high etch selectivity towards silion can be used. After patterning layer 44, a mask layer, e.g. resist layer 45 is applied and patterned (FIG. 4(c)), the resist pattern corresponding to locations where the fixed fingers 21 are to be formed. Next, as illustrated in FIG. 4(d), a first anisotropic etching step, such as e.g. a DRIE (Deep Reactive Ion Etching) step, is performed for etching completely through the functional layer 43 of the SOI substrate 40, using the resist layer 45 and the oxide layer 44 as a mask. The resist layer 45 is then removed (FIG. 4(e)), e.g. in an oxygen plasma, by means of acetone or by microstrip, thereby exposing the functional silicon layer 43 at locations where fixed fingers are to be formed. Subsequently a second anisotropic etching step, such as e.g. a time-controlled DRIE step, using the oxide layer 44 as a mask, is performed. As illustrated in FIG. 4(f), this second anisotropic etching step recesses (reduces the height of) the exposed silicon elements (corresponding to locations where the fixed fingers are to be formed) by a few µm, e.g. by 5 µm. In this way, beam-shaped silicon elements 431, 432 with two different heights are formed: first silicon elements 431 have a height that is larger (e.g. by a few µm, e.g. by 5 µm) than the height of second silicon elements 432. In the example shown, second silicon elements 432 correspond to locations where fixed fingers 21 are to be formed and first silicon elements 431 correspond to locations where movable fingers 22, fixation structures 24, 26 and suspension elements 25 are to be formed. In a next step the oxide layer 44 is removed (FIG. 4(g)) by any method known by a person skilled in the art, such as e.g. by means of diluted HF, thereby also partly removing the intermediate oxide layer 42 of the SOI substrate. In this stage of the process, the first silicon elements 431 and second silicon elements 432 still adhere to the substrate. Next a capping wafer 46, for example a silicon wafer, is bonded to the SOI wafer (FIG. 4(h)), e.g. by means of thermo-compression (e.g. copper-based thermo-compression) or by means of eutectic bonding (e.g. gold-based eutectic bonding) or by any other suitable bonding method known by a person skilled in the art. The capping wafer 46 is then structured by defining a masking layer 47, e.g. an oxide layer or a nitride layer, on the capping wafer 46 (FIG. 4(i)) and etching the capping wafer 46, e.g. in a sequence of a wet anisotropic etching step, e.g. using KOH, TMAH, EDP or any other suitable wet anisotropic etchant (FIG. 4(j)), and a DRIE step (FIG. 4(k)). The masking layer 47 may then be removed. In this way a body 28, e.g. seismic mass 23, is formed above the silicon elements 431, 432 (i.e. vertically integrated with the silicon elements 431, 432), the body 28, e.g. seismic mass 23, being physically connected to the subset of elements 431 that have not been recessed by the second anisotropic etching step described above (FIG. 4(f)) and not being connected to the elements 432 that have been recessed by this second anisotropic etching step. Next a release etch is performed, i.e. the intermediate oxide layer 42 is removed, whereby due to lateral underetching the silicon elements 431, 432 corresponding to locations where fixed fingers 21, movable fingers 22 and suspension elements 25 are to be formed are released as well. The lateral underetching is controlled not to release the silicon elements 431 where fixation structures 24, 26 are to be formed. This release etching may be done by any means known by a person skilled in the art, such as for example by means of BHF or gaseous HF. The resulting structure is illustrated in FIG. 4(l).

Figure 4K:
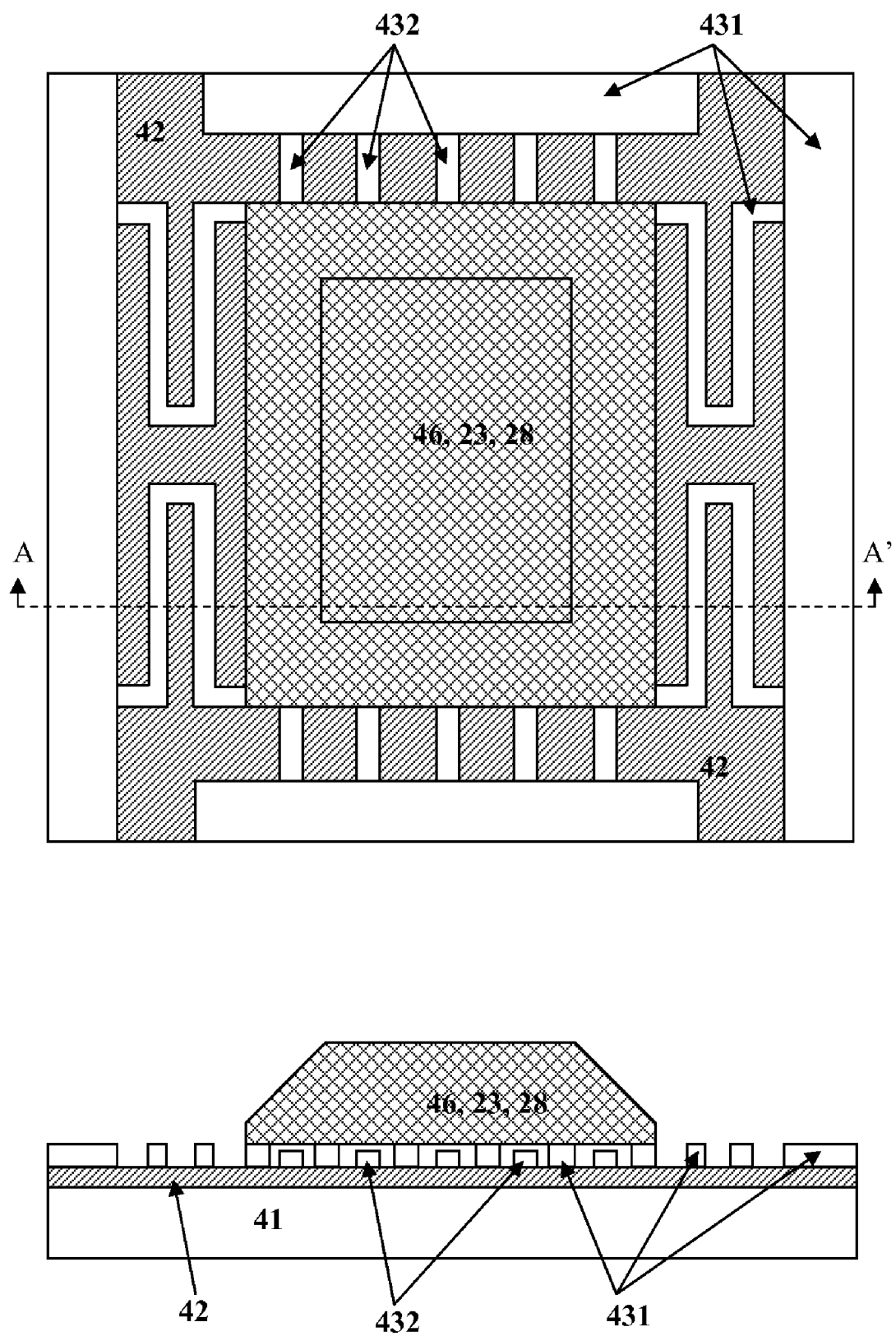
Figure 4I:
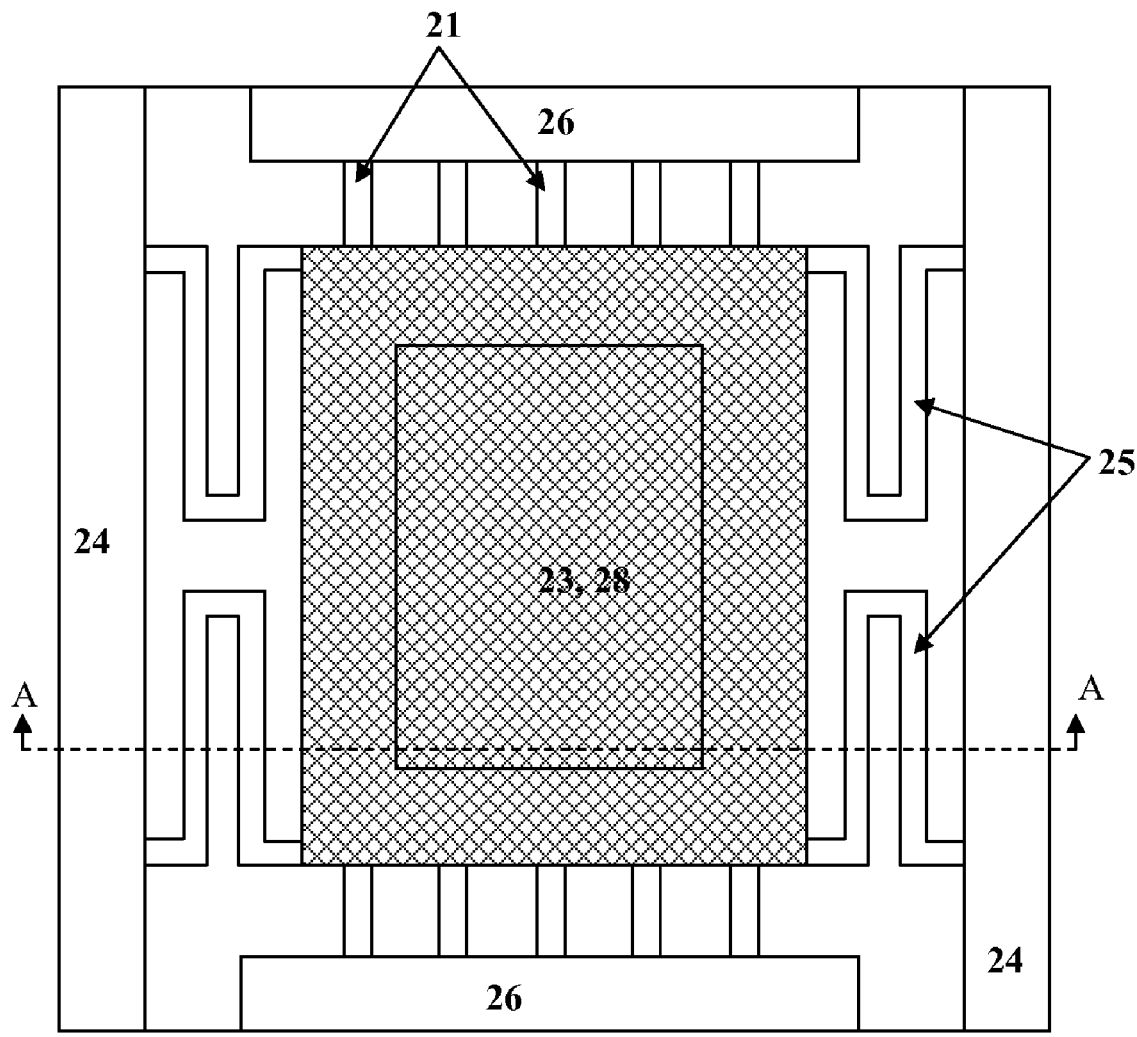
Figure 4I:
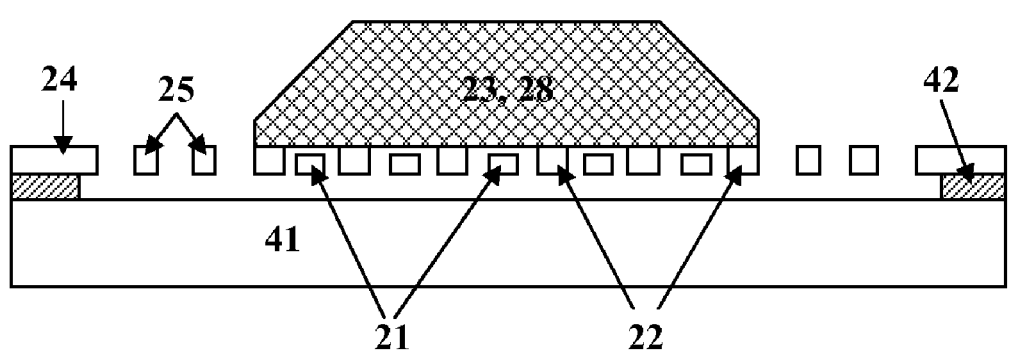
Figure 4M:
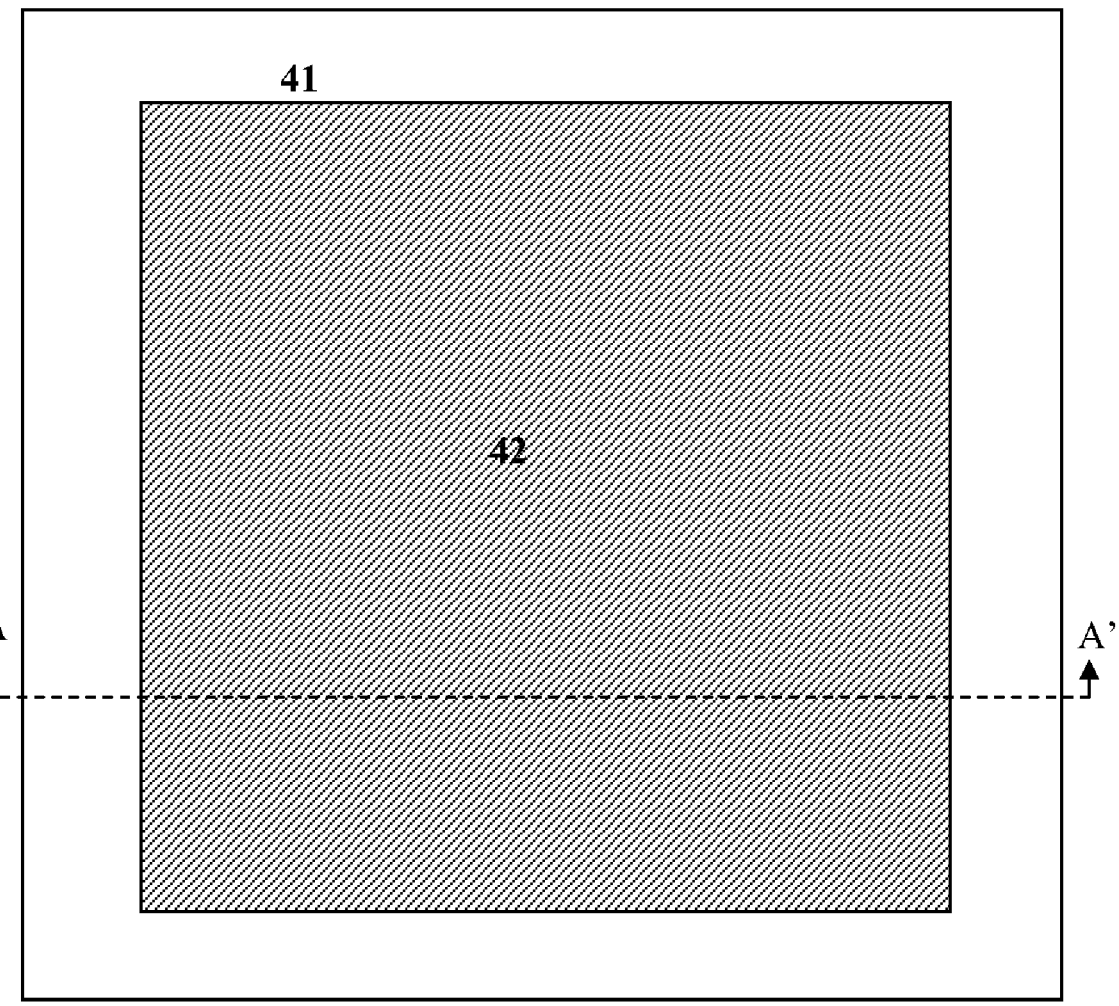
Figure 4M:
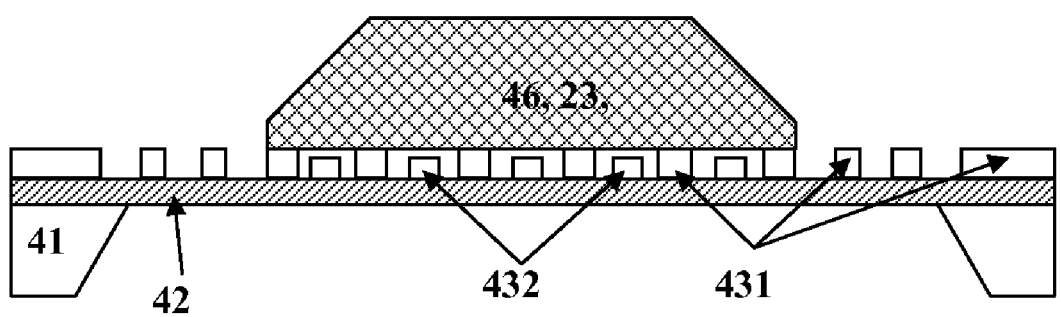
Figure 4N:
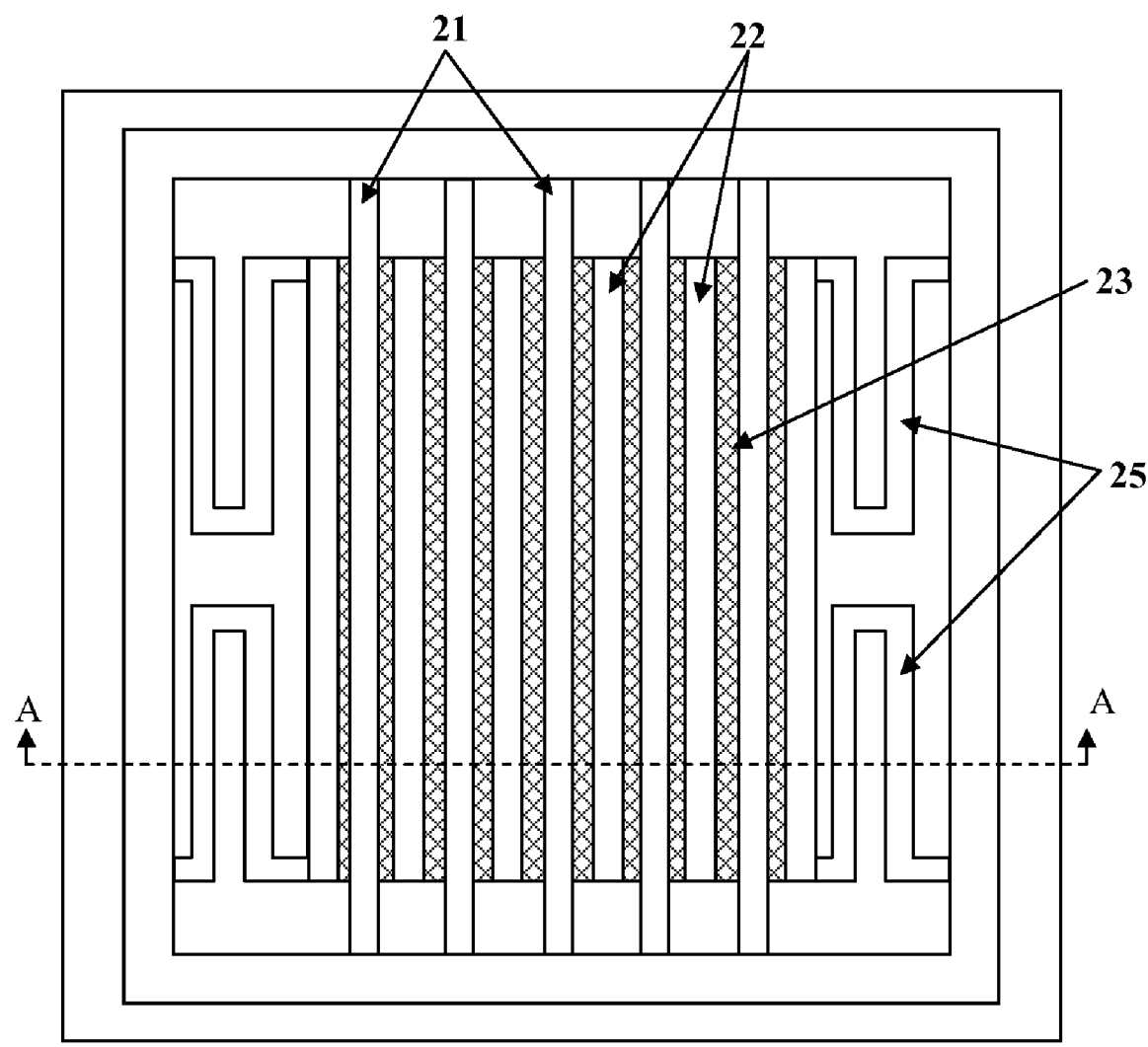
Figure 4N:
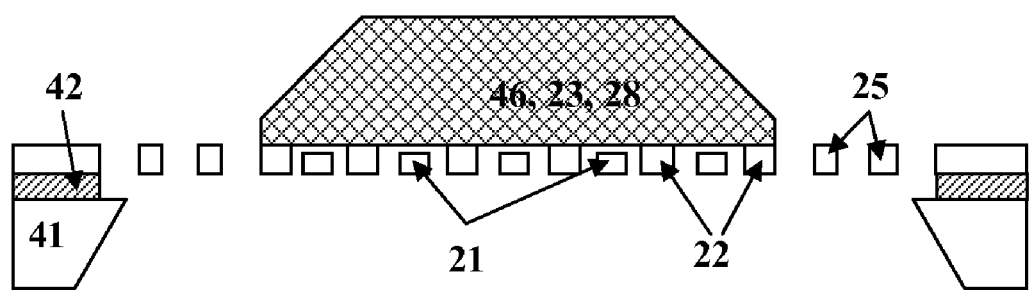

In an alternative embodiment (illustrated in FIG. 4(m) and FIG. 4(n)), after obtaining the structure shown in FIG. 4(k), an opening may be etched in the SOI wafer from the backside (through the handling layer 41), such that the handling layer 41 is completely removed at least in an area corresponding to a zone where the fingers and the suspension elements are to be formed (FIG. 4(m)). This etching step may be performed by any method known by a person skilled in the art, such as for example, by means of KOH etching, using the intermediate oxide layer 42 as an etch stop layer. The release etching then comprises removal of the intermediate oxide layer 42, e.g. in BHF or in gaseous HF or by dry etching (FIG. 4(n)).

Figure 5A:
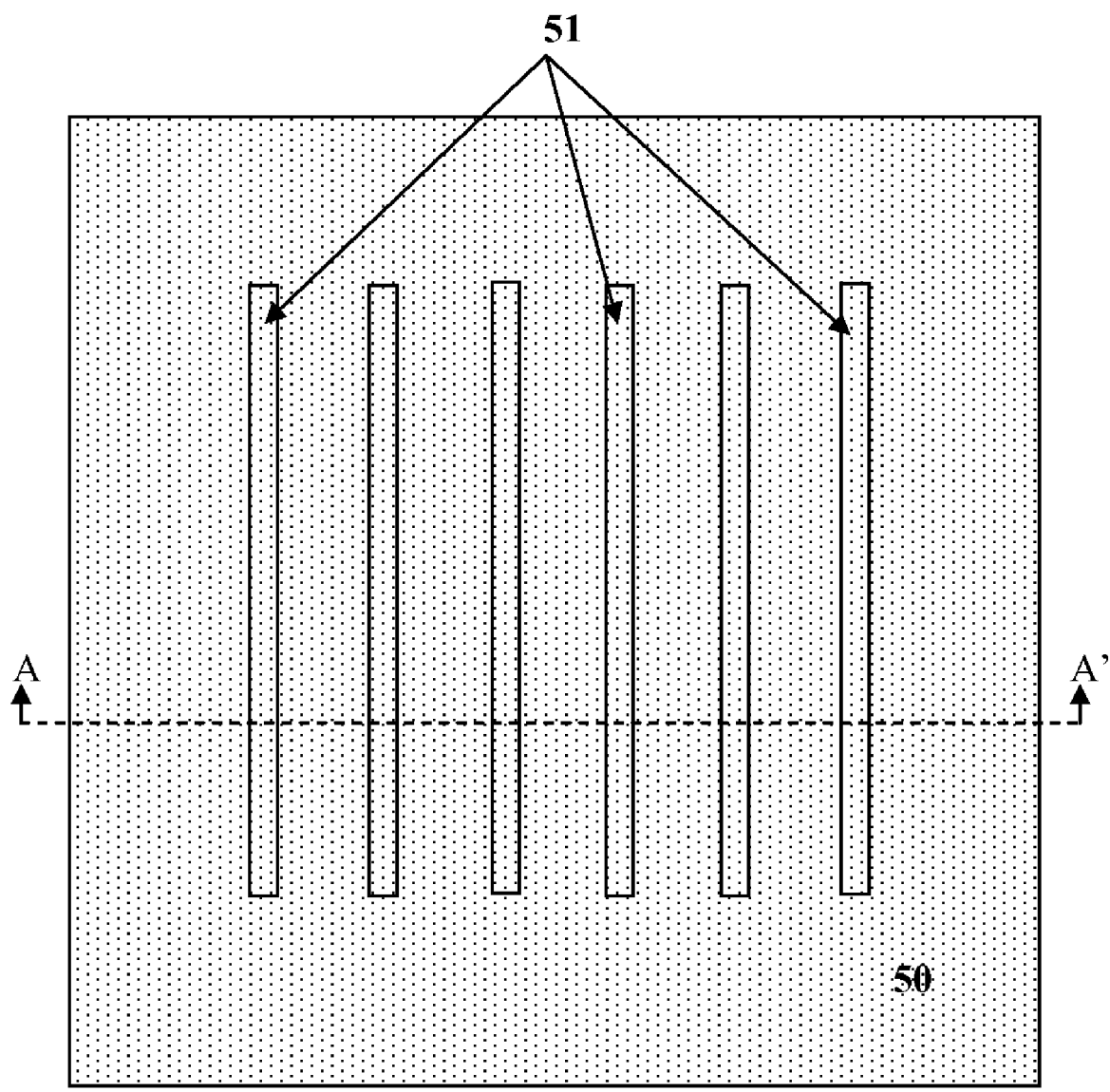
FIGS. 5(a) to 5(i) illustrate a manufacturing process for fabricating an electrostatic energy scavenger of a present embodiment. In each Figure the top drawing shows a top view of the structure and the bottom drawing shows a cross section along line A-A'.
Figure 5A:
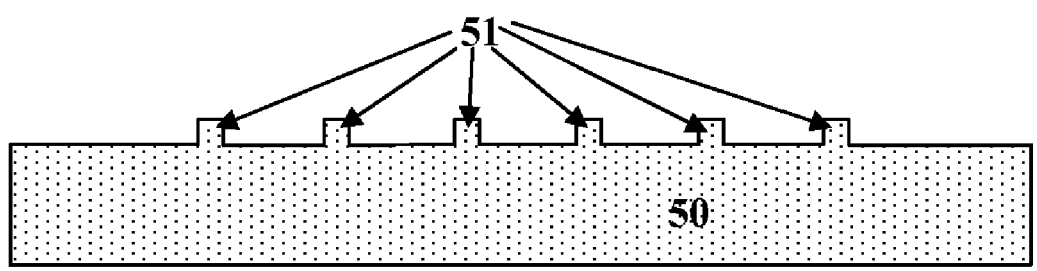
Figure 5B:
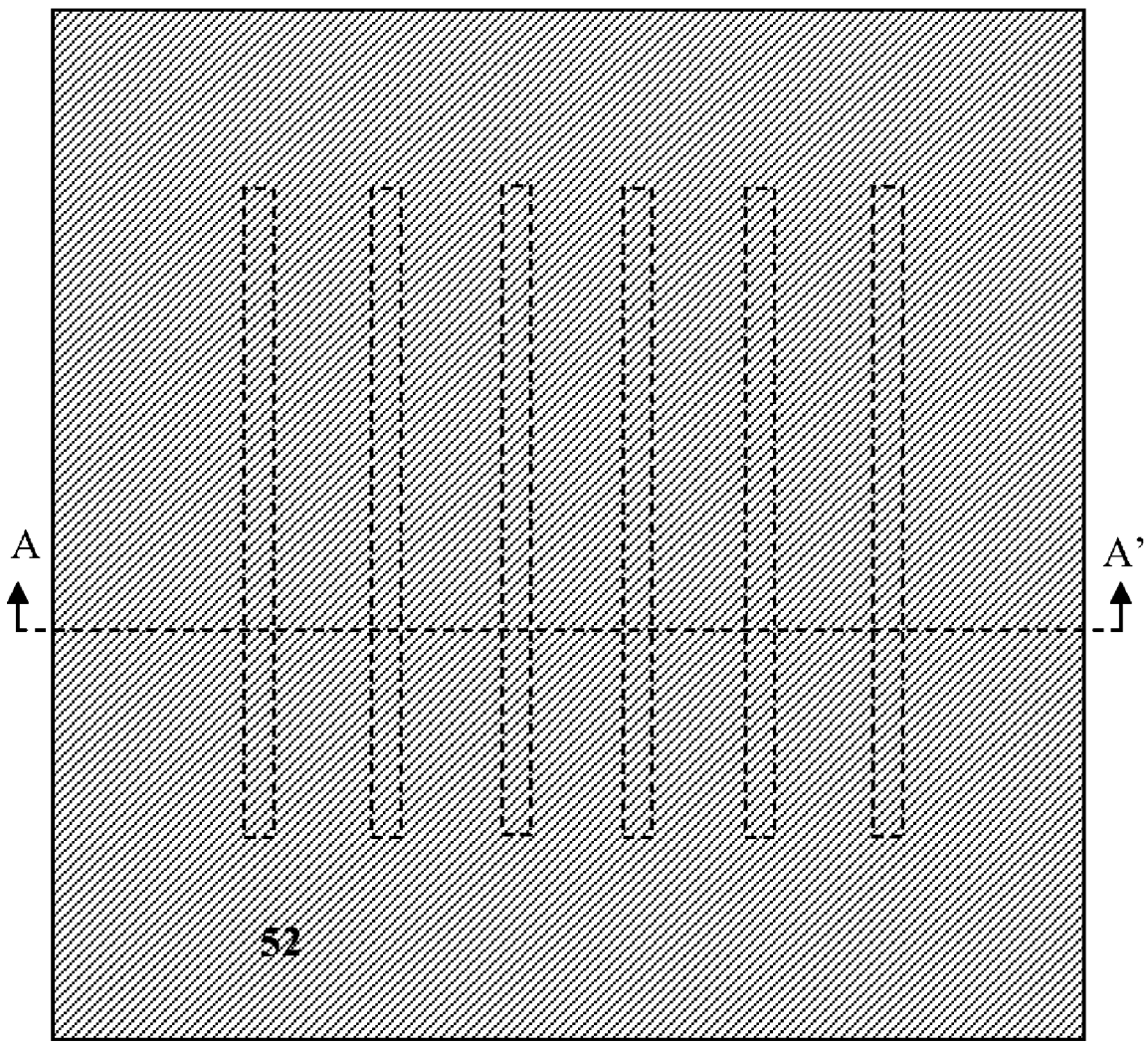
Figure 5B:
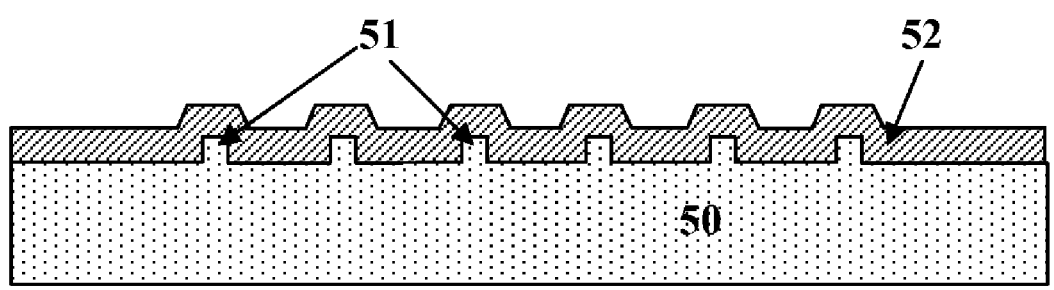
Figure 5C:
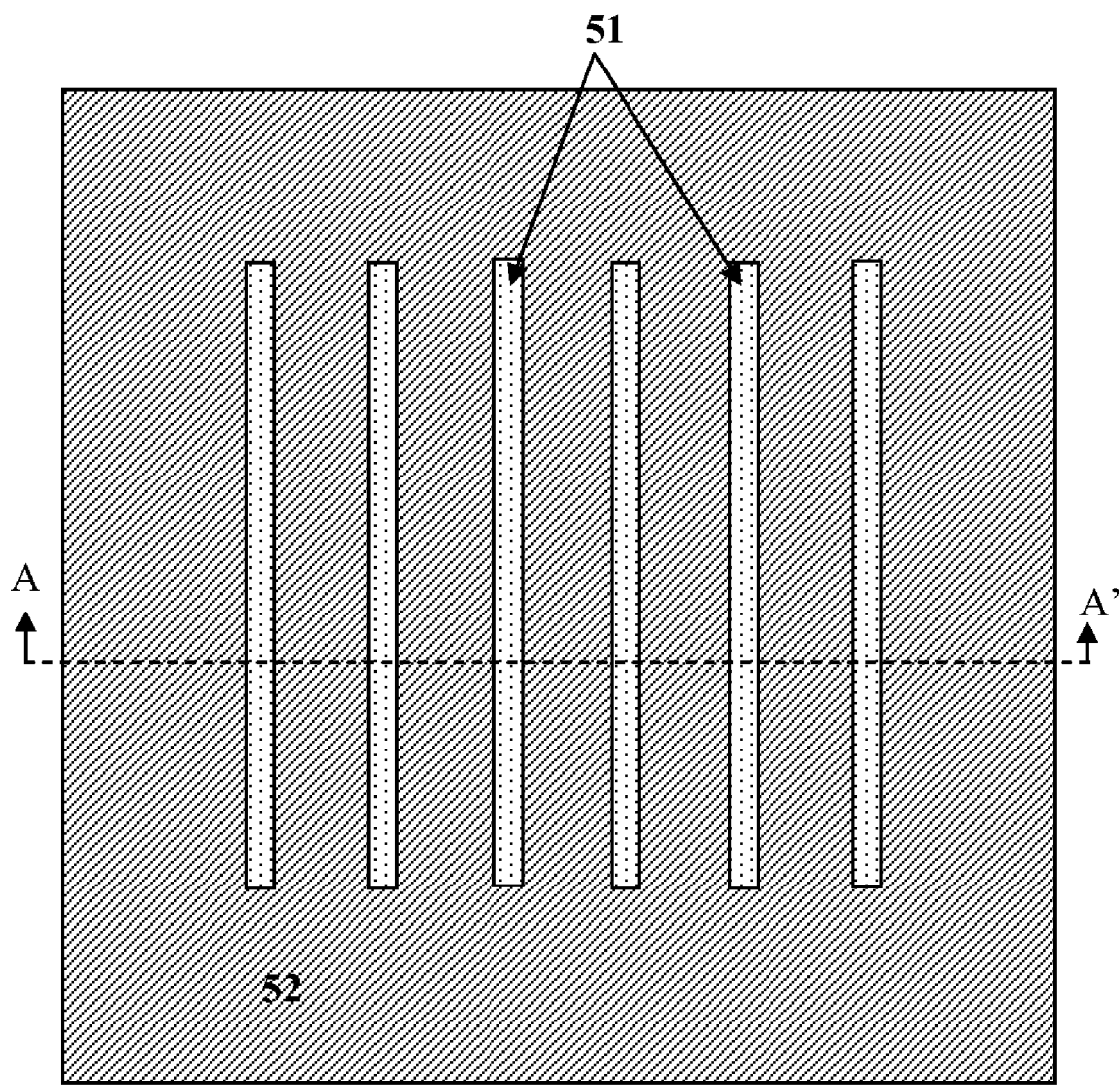
Figure 5C:
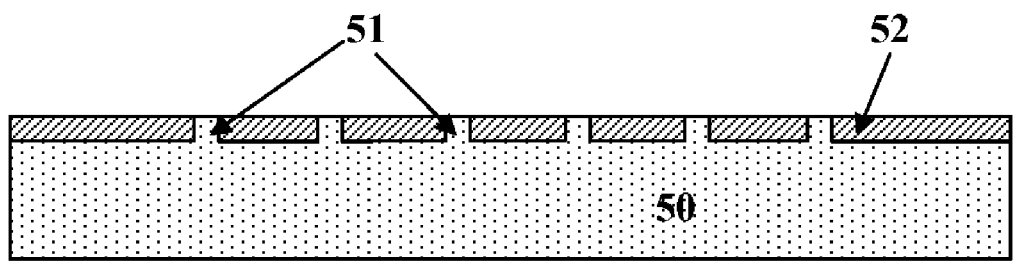
Figure 5D:
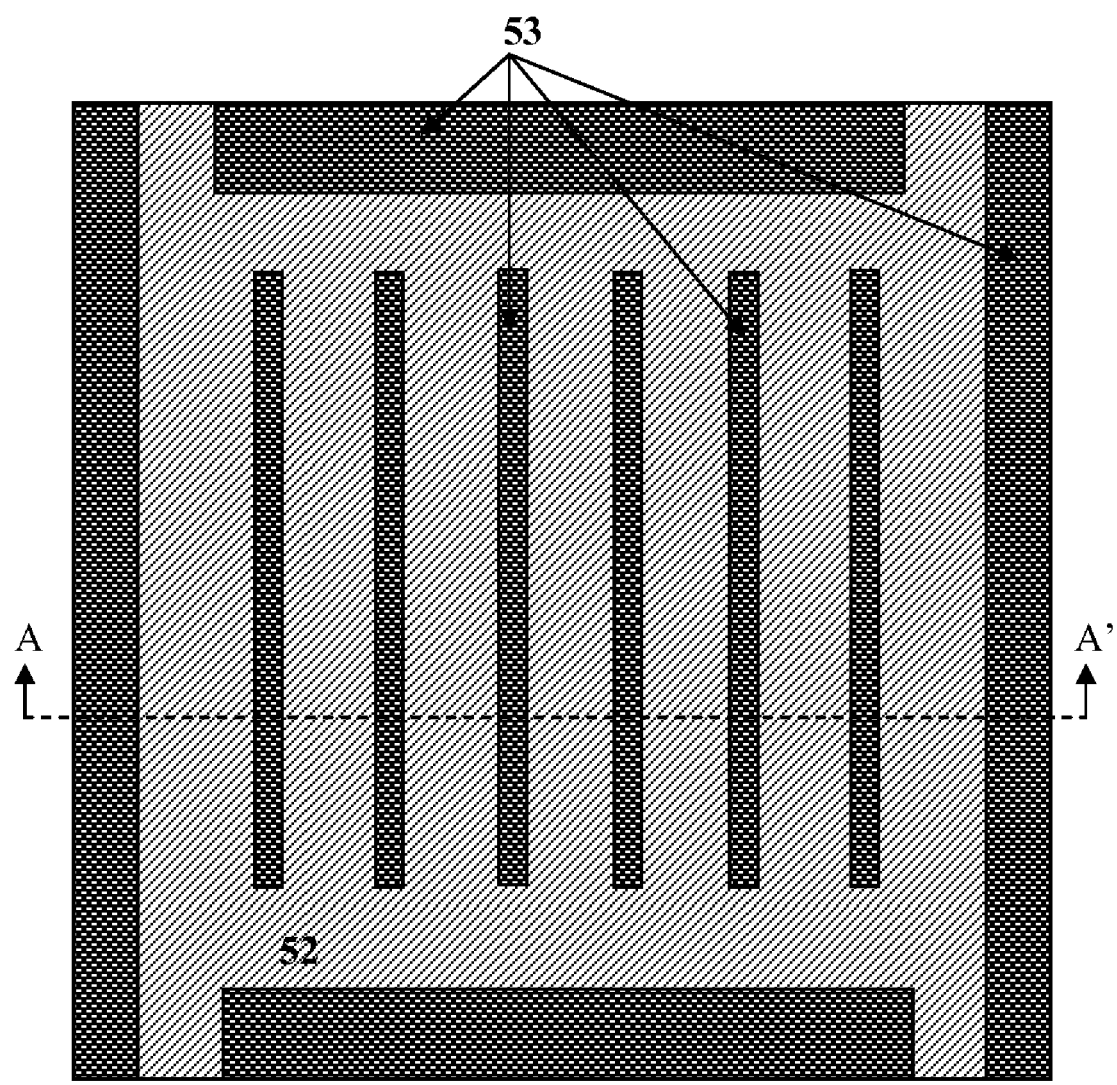
Figure 5D:
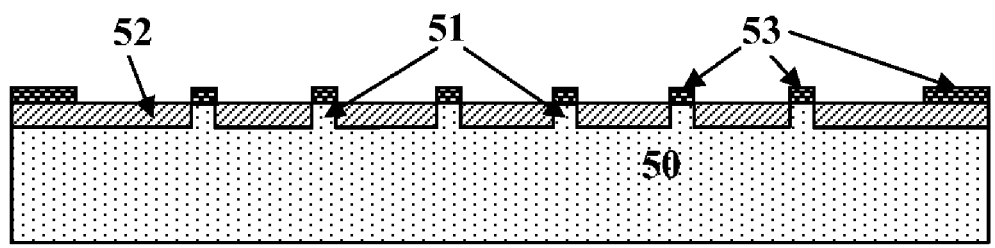
Figure 5E:
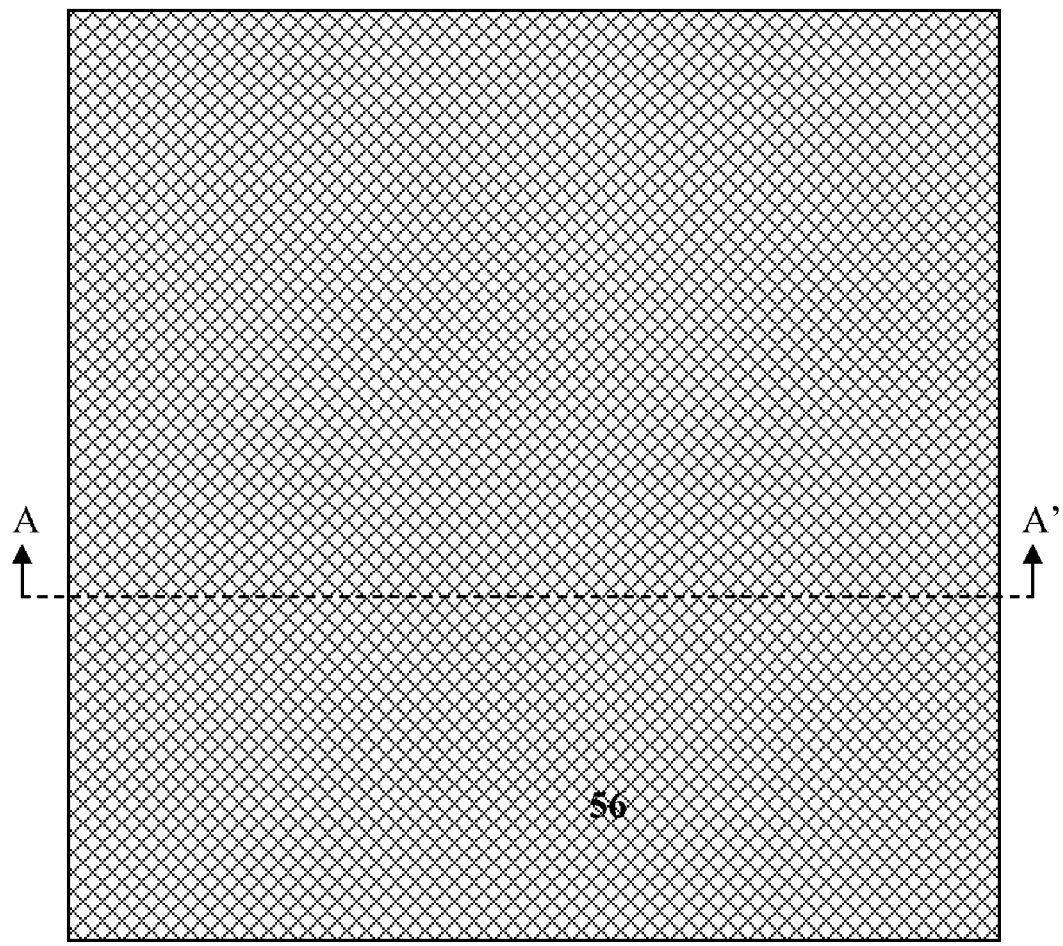
Figure 5E:
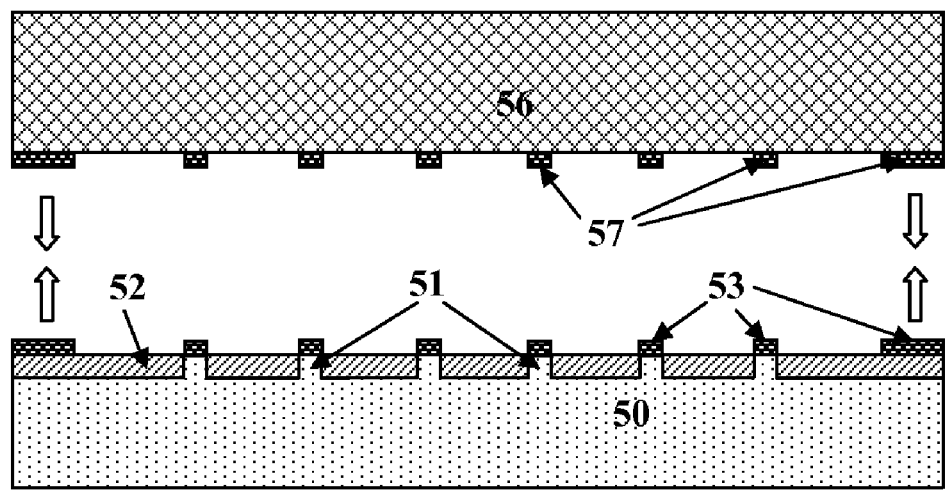
Figure 5F:
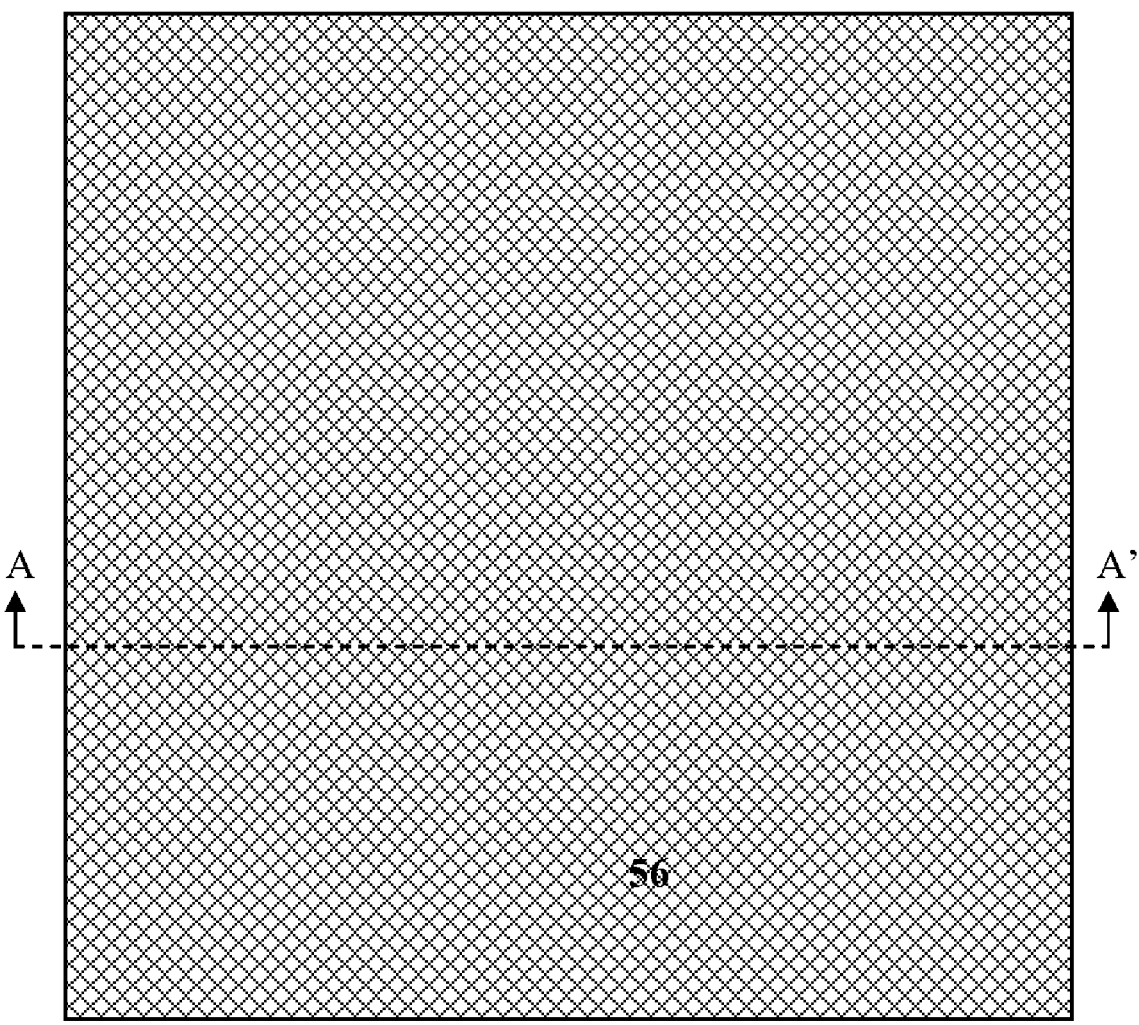
Figure 5F:
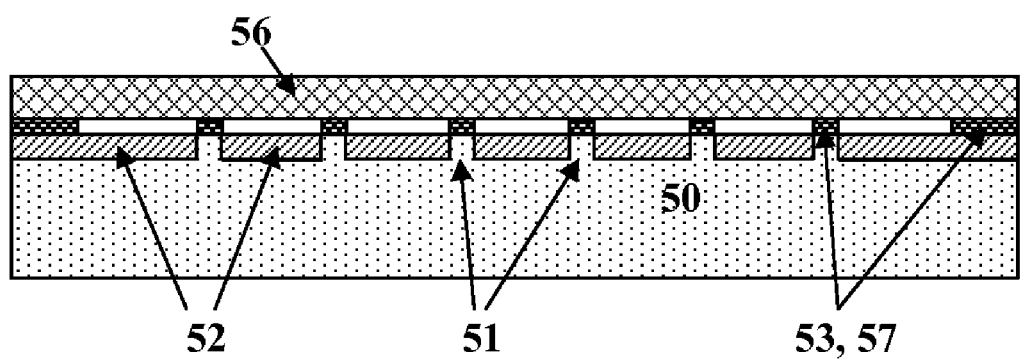
Figure 5G:
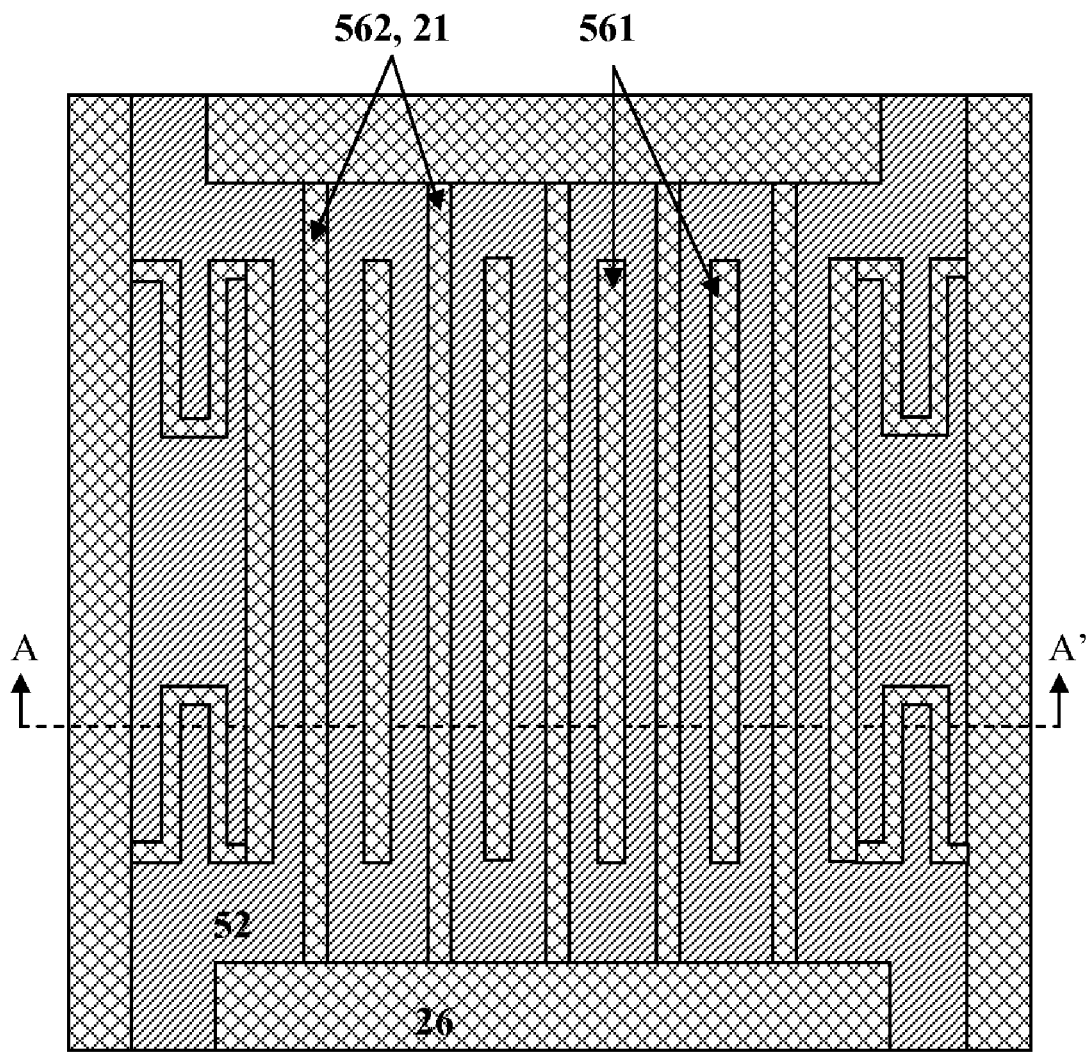
Figure 5G:
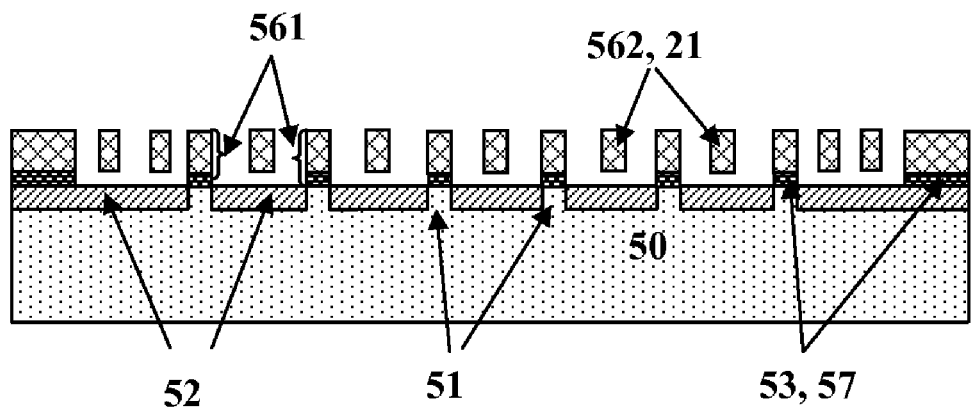
Figure 5H:
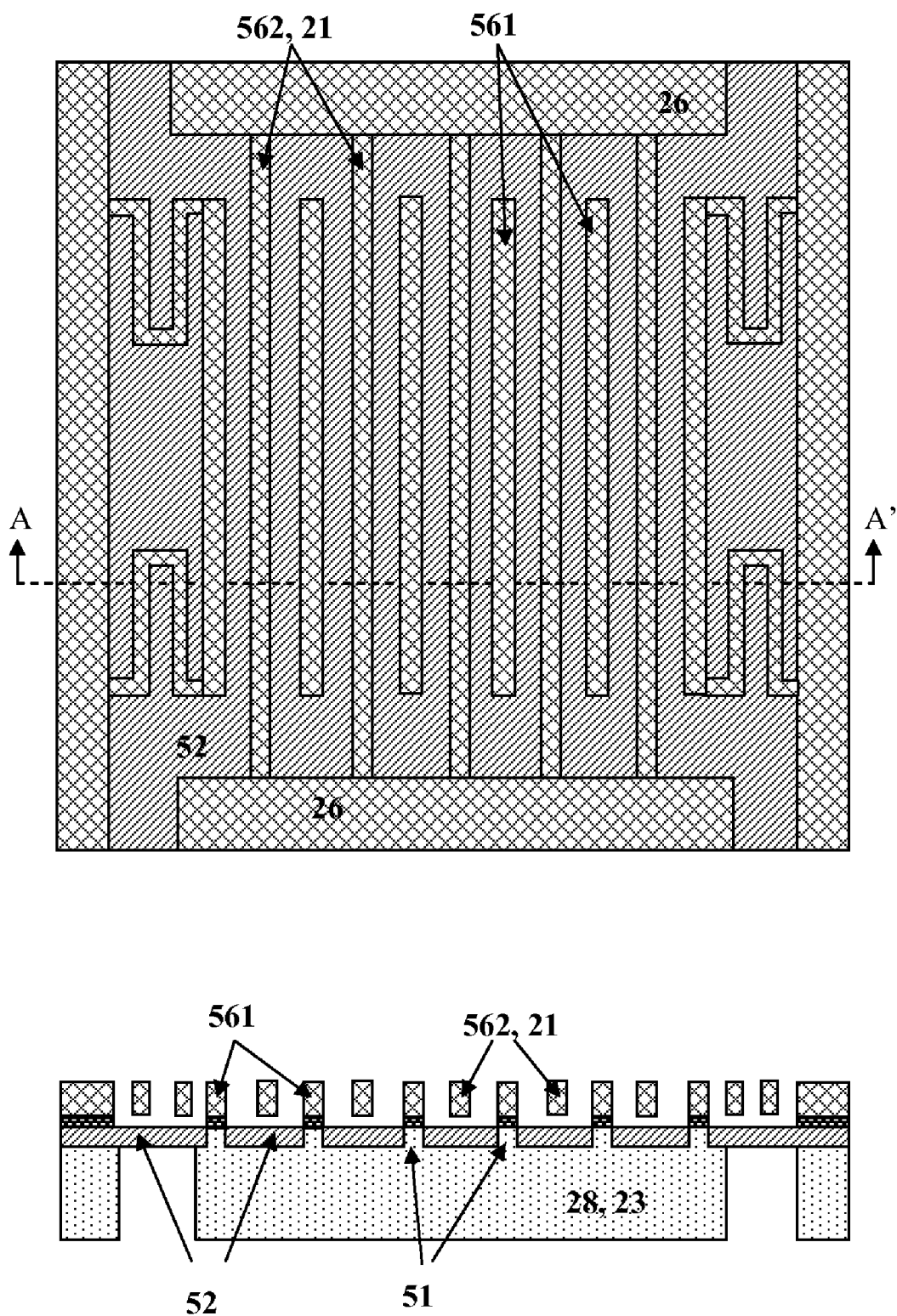

An alternative fabrication method for an electrostatic scavenger 20 according to a present embodiment is illustrated in FIGS. 5(a) to 5(i). In this embodiment the connection means 28, e.g. comprising a seismic mass 23, is fabricated from the substrate itself. For example, a silicon substrate 50 may be used. However, any other substrate known by a person skilled in the art that is suitable for manufacturing the microstructure may be used. In a first step the substrate 50 is structured such that shallow beam-shaped features 51, e.g. features with a height in the range between 1 µm and 20 µm, e.g. in the range between 5 µm and 10 µm are formed at locations where movable electrode fingers 22 are to be formed (FIG. 5(a)). Structuring the substrate 50 can be done by any suitable method known by a person skilled in the art. For example, a mask layer (e.g. comprising silicon nitride or silicon dioxide) can be provided on the substrate and patterned, followed by a silicon etching step, e.g. a wet etching step, and removal of the mask layer. In a next step, as illustrated in FIG. 5(b), a thick sacrificial layer 52 such as e.g. a PECVD silicon oxide, an APCVD oxide, BPSG or spin-on glass is provided on the substrate 50, the thickness of the sacrificial layer 52 being larger than the height of the features 51 on the substrate 50. Next the surface is flattened, for example by means of a Chemical Mechanical Polishing (CMP) step (FIG. 5(c)). In this flattening or polishing step the silicon of the substrate 50 acts as a stopping material, i.e. the flattening step stops when silicon material is reached. Because of the presence of the shallow silicon features 51 at the surface this results in the structure shown in FIG. 5(c), wherein the shallow features 51 extend to the surface of the structure and wherein in between the shallow features 51 the sacrificial layer material 52 is present at the surface. Next a thin layer 53 comprising a metal such as for example gold or aluminum may be deposited on the surface. This metal layer 53 is patterned (FIG. 5(d)) to define areas where a capping wafer is to be bonded to the substrate. For example, the patterned metal layer 53 may be present at locations where movable fingers 22 are to be formed (corresponding to the location of the shallow features 51) and at locations where fixation structures 24, 26 are to be formed. Then a capping wafer 56, e.g. a silicon wafer, is provided. In the example shown in FIG. 5(e), a thin patterned metal layer 57 is provided on the capping wafer 56, wherein the pattern of the metal layer 57 on the capping wafer 56 is substantially the same as the pattern of the metal layer 53 on the substrate (FIG. 5(e)). The capping wafer 56 is then bonded (e.g. by eutectic bonding, thermo-compression or silicon fusion bonding) to the substrate. More in particular, the metal pattern 57 on the capping layer is bonded to the metal pattern 53 on the substrate, wherein the metal pattern 53 on the substrate and the metal pattern 57 on the capping wafer are aligned with each other. In an alternative embodiment the capping wafer 56 can as such (i.e. without having a metal pattern 57) be bonded to the patterned metal layer 53 on the substrate. The thickness of the capping wafer 57 may then be reduced, e.g. by etching and polishing or wafer grinding, to a desired thickness, e.g. a thickness in the range between 50 μm and 150 μm, e.g. a thickness in the range between 80 μm and 120 μm, e.g. a thickness in the range between 90 μm and 110 μm (FIG. 5(f)). In a next step the capping wafer 56 is structured by anisotropic etching, e.g. DRIE etching, through the capping wafer. Thereby the capping wafer material 56 is completely removed, except at locations where fixation structures 24, 26, suspension elements 25, fixed fingers 21 or movable fingers 22 are to be formed (FIG. 5(g)). In this stage of the process a plurality of fixed fingers 21 is already present. The plurality of fixed fingers 21 is not in direct physical contact with the substrate, but they are suspended between fixation structures 26 anchored to the substrate. A plurality of movable fingers 22 is still to be provided. The beam-shaped elements 561 for forming these movable fingers 22 are already present (at locations corresponding to the location of the shallow features 51 formed on the substrate in an earlier process step), but these beam-shaped elements still need to be released to make them movable (as further described), thereby forming the movable fingers 22. As is clear from FIG. 5(g), in this stage of the process two types of beam-shaped elements are present: first beam-shaped elements 561 where movable fingers are to be formed and second beam-shaped elements 562 corresponding to fixed fingers 21, the first beam-shaped elements 561 having a larger height than the second beam-shaped elements 562. In order to release the first beam-shaped elements 561 for forming movable fingers 22, the substrate is 50 patterned (FIG. 5(h)). More in particular, an etching step, e.g. a dry etching step wherein the sacrificial layer 52 may act as an etch stop layer, is performed wherein etching is done through the substrate 50 from the backside, at least in an area corresponding to locations in between the fixation structures 24, 26 and the plurality of first beam-shaped elements 561. As illustrated in FIG. 5(h), the substrate 50 then provides the body in the form of the means 28 for physically connecting the plurality of movable fingers 22, and it provides the seismic mass 23. Finally the sacrificial layer 52 may be removed, e.g. by wet or dry etching, e.g. using gaseous hydrofluoric acid time-controlled etching (FIG. 5(i)).

The micromachined structure described herein, wherein a seismic mass is vertically integrated with a fixed electrode comprising a plurality of fixed fingers and with a movable electrode comprising a plurality of movable fingers, is described above as part of an electrostatic scavenger. However, the same structure or a similar structure may be used in other devices wherein a conversion between kinetic energy and electrical energy occurs, such as for example accelerometers.

It is preferred to minimize parasitic capacitances in devices according to some of the embodiments. It is preferred that a capacitance is only present between the fixed electrodes comprising the fixed fingers 21 and the movable electrodes comprising the movable fingers 22. However, the presence of a dielectric layer such as an oxide (e.g. intermediate oxide layer 42, sacrificial layer 52) in the structure may result in parasitic capacitors. These parasitic capacitors may for example be formed between the fixation structures 26 of the fixed electrodes and the substrate 41, 50 as well as between the fixation structures 24 of the suspension elements and the substrate 41, 50. As both parasitic capacitors share the substrate as a common terminal they are connected in series. Therefore, the smaller parasitic capacitor determines the total parasitic capacitance Cpar. As the parasitic capacitor is in parallel to the variable MEMS capacitor CMEMS, its value also influences the electrical bandwidth of the device. The parasitic effects of Cpar can only be neglected if it is substantially smaller than the minimum value of CMEMS (Cmin). This can be realized by a proper design, for example by using small anchor pads for the suspension elements.

Figure 6:
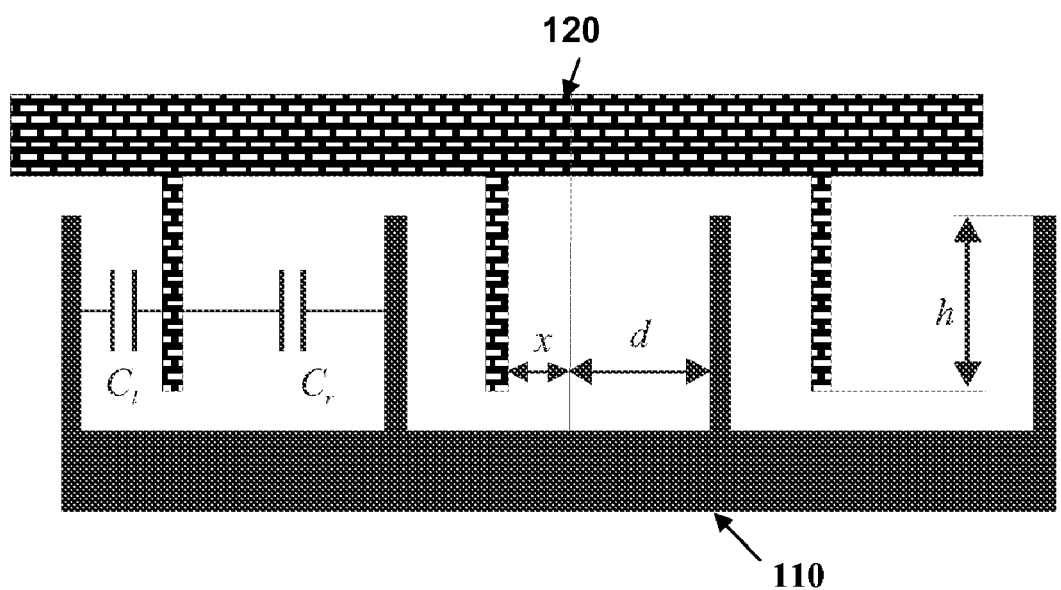
FIG. 6 shows a cross-sectional view of a gap-closing capacitor structure.

For the electrostatic scavenger structure described herein, simulations were performed. Capacitance extraction and coupling to the electrical domain was done using system level simulators such as MATLAB/Simulink or SABER. The capacitor of the gap-closing (GCL) design comprises two variable capacitors, one of which decreases and the other one increases in capacitance upon displacement of the movable electrode as shown in FIG. 6. As the movable electrode moves, the capacitance of one capacitor increases while the other one decreases. The two capacitors Cl and Cr are electrically connected in parallel. The capacitances are given by:

$$C_l = N \cdot \varepsilon \frac{h \cdot l}{d+x} \quad C_r = N \cdot \varepsilon \frac{h \cdot l}{d-x} \tag{1}$$

wherein h is the height of the structure, l denotes the structure's length, d gives the capacitor's airgap when the electrodes are centered and x is the displacement of the movable electrode with respect to the centered position (FIG. 6). The number of electrode pairs is given by N.

The total capacitance can be calculated as $$\begin{aligned} C_l + C_r &= N \cdot \varepsilon \cdot h \cdot l \left( \frac{1}{d+x} + \frac{1}{d-x} \right) \\ &= N \cdot \varepsilon \frac{h \cdot l}{d} \left( \frac{1}{1+x/d} + \frac{1}{1-x/d} \right) \\ &= N \cdot \varepsilon \frac{h \cdot l}{d} \frac{2}{1-(x/d)^2} \\ &= C_0 \frac{1}{1-(x/d)^2} \end{aligned} \tag{2}$$

The mass experiences a force during the energy conversion in phase 3 (described above), which is to be considered in the modeling of the mass' dynamics. The force can be derived from the energy present in the capacitor:

$$W_l = \frac{1}{2} \frac{q_l^2}{C_l} = \frac{1}{2} Q^2 \frac{C_l}{(C_l+C_r)^2} \tag{3}$$

$$W_r = \frac{1}{2} \frac{q_r^2}{C_r} = \frac{1}{2} Q^2 \frac{C_r}{(C_l+C_r)^2}$$

$$W = \frac{1}{2} Q^2 \frac{1}{C_l+C_r} = \frac{1}{4} \frac{d}{\varepsilon A} Q^2 (1-(x/d)^2)$$

Here $q_l$ and $q_r$ denote the charge stored in the left and right sections of the variable capacitor. Q gives the total charge. The electrostatic force can be found through spatial derivation of the energy. One has to consider that the forces in both capacitors are acting in opposite directions. Therefore, both capacitors are considered independently. From equations (1) and (3) the electrostatic force is derived to be:

$$F_{ES} = -\frac{\partial W}{\partial x} = \frac{1}{2} \frac{Q^2}{\varepsilon A} \frac{x}{d} \tag{4}$$

This results in a displacement dependent force which can be modeled through an additional electrostatic spring.

Figure 7:
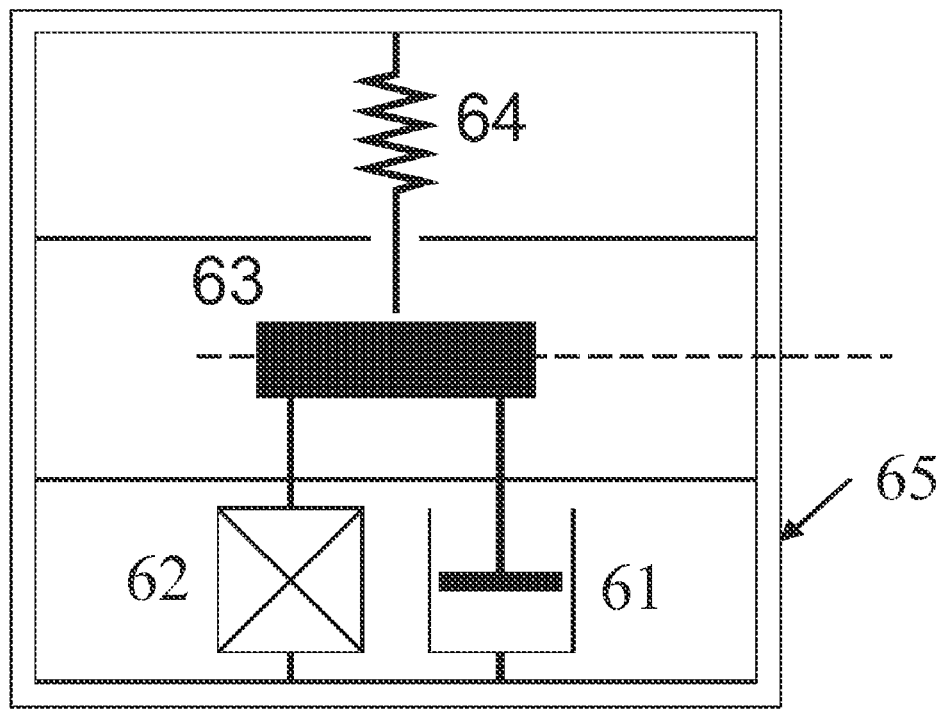
FIG. 7 illustrates the mechanical model used for modeling the electrostatic scavenger.

The mechanical configuration can be described as a damped spring-mass system. FIG. 7 illustrates the mechanical model. The spring mass system is damped by a classical viscous damped force 61 and an electrostatic force 62. A body 63 of mass m is considered, the mass being suspended by a spring 64 (suspension element) of stiffness k to a fixation structure 65 or frame. If the frame 65 is subjected to a displacement y the mass 63 will experience a displacement x relative to the moving frame. The corresponding equation of motion is given as:

$$m\ddot{x} + F_{ES} + F_m + kx = -m\ddot{y} \quad (5)$$

Here, $f_{ES}$ and $f_m$ are electrostatic and mechanical damping forces respectively. Mechanical damping includes e.g. structural, slide and squeeze film damping, while electrostatic damping arises from energy extraction during the motion. The electrostatic force is defined by equation (4).

Figure 8:
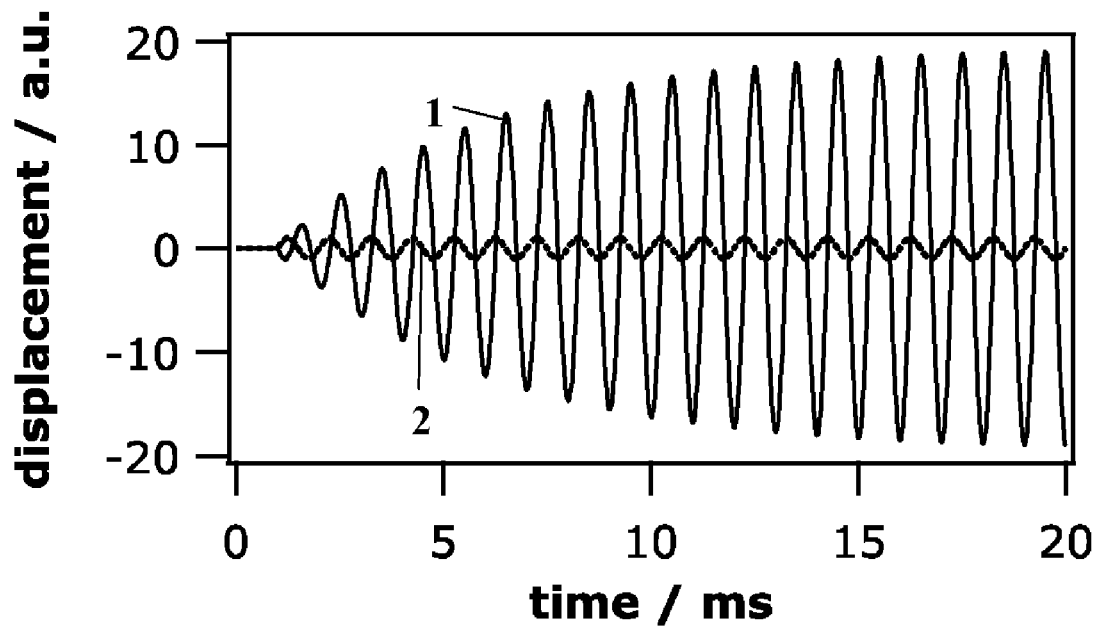
FIG. 8 is a graph showing the displacement of the seismic mass under harmonic excitation.
Figure 9:
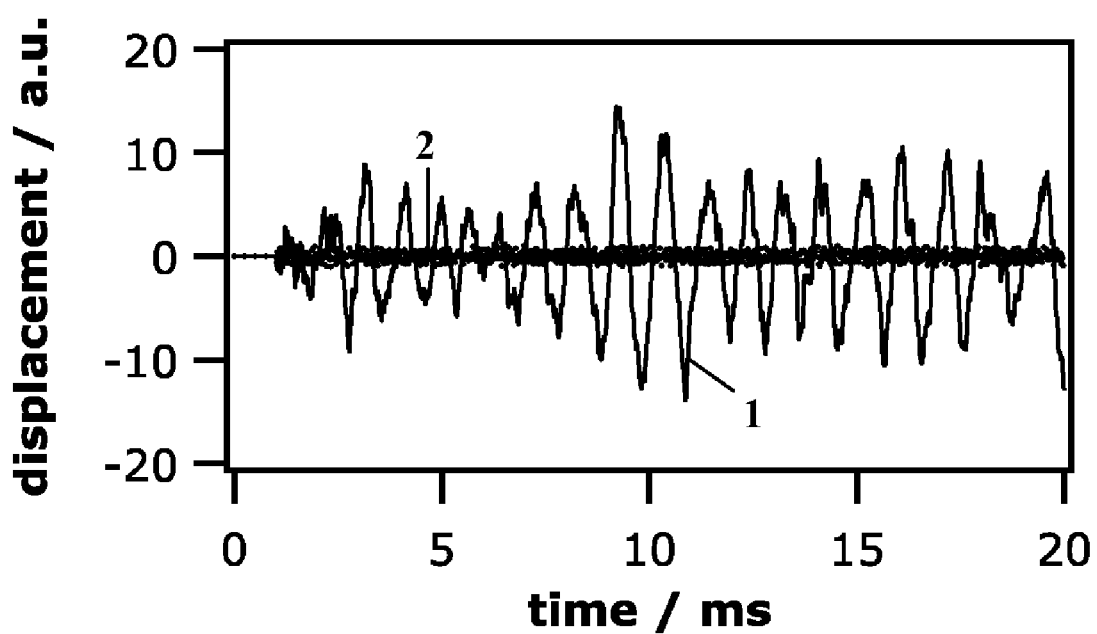
FIG. 9 is a graph showing the displacement of the seismic mass under broadband excitation (bandwidth limited white noise spectrum).

Due to the non-linearity of the damping mechanisms an analytical solution of (5) does not exist. Therefore, a numerical solver was employed for this model. The resulting response of the mass 63 to harmonic and noise excitation is shown in FIG. 8 and FIG. 9 respectively. In both Figures, curve 1 shows the mass displacement and curve 2 shows the excitation (corresponding to the displacement of the frame 65). As the system is excited near its resonance frequency (fres=1 kHz) the mass exhibits a high displacement amplitude. This amplitude is limited by the system's inherent damping. For optimum performance the displacement amplitude of the mass should almost reach its structural limitation defined by the frame. Small displacement amplitudes do not provide sufficient capacitance change, while the occurrence of an impact leads to loss of kinetic energy.

Figure 10:
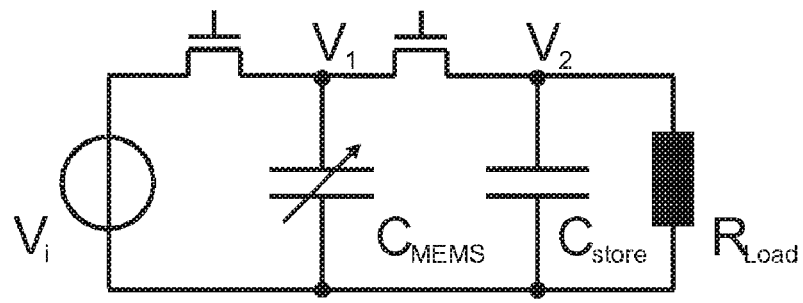
FIG. 10 schematically shows an electrical harvesting circuit for a gap-closing variable capacitor.
Figure 12:
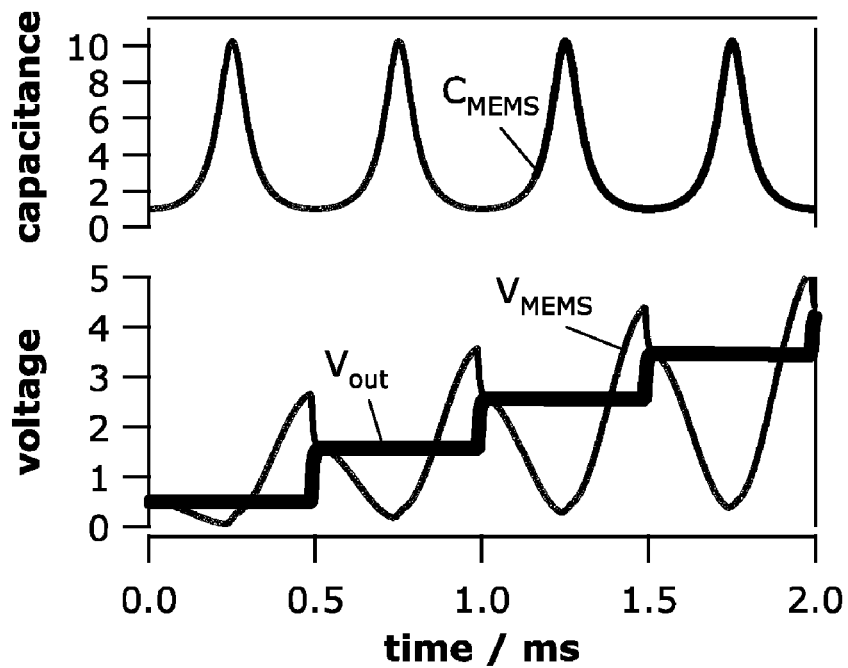
FIG. 12 is a graph showing the varying voltages, driven by a variable MEMS capacitor. The incremental charge transfer increases the output voltage gradually.
Figure 13:
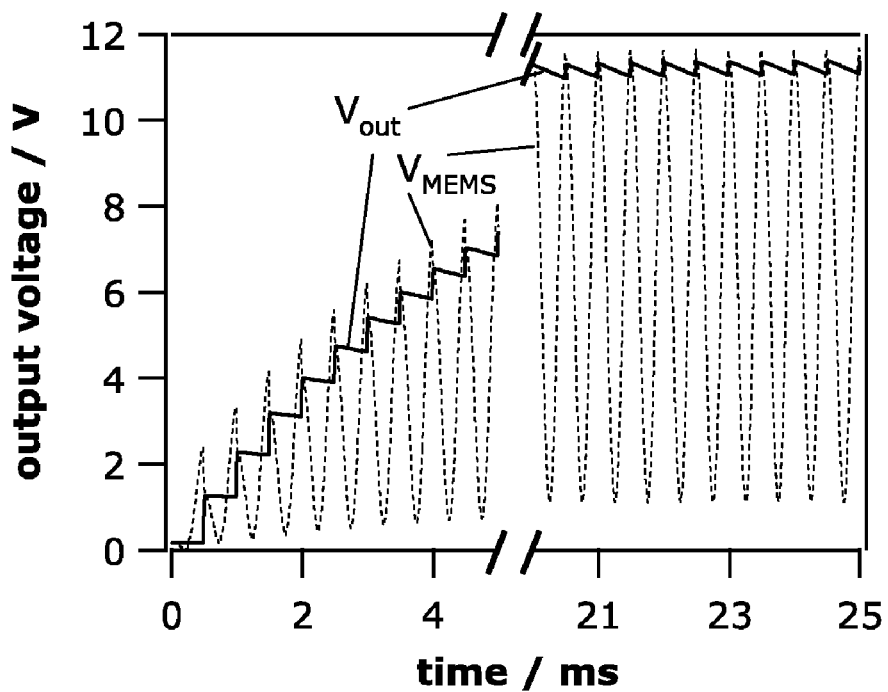
FIG. 13 illustrates the saturation of the output voltage at 11.2 V with an input voltage of 1 V.

The variable MEMS capacitor $C_{MEMS}$, formed between the fixed electrode and the movable electrode, is an important component of an electrostatic energy scavenger. Its operation makes use of additional blocks such as e.g. a voltage block, switches and a storage capacitor as shown in FIG. 10. One may derive the equations for satisfying the Kirchhoff laws at nodes V1 and V2. This classical circuit analysis leads to a system of two coupled differential equations of first order. As the switches discretely change their states a closed solution is not possible and a numerical solver was employed. A periodic capacitance change was assumed and the resulting voltages were determined. The results, as obtained through MATLAB/Simulink are shown in FIG. 12 and FIG. 13. FIG. 12 shows the varying capacitance $C_{MEMS}$ (top part) and the corresponding varying capacitor voltage $V_{MEMS}$ (corresponding to the voltage at node V1) and output voltage $V_{out}$ (corresponding to the voltage at node V2) (bottom part). As is clear from FIG. 12 the output voltage increases step-wise. This is due to the accumulated charge in the storage capacitor $C_{stor}$. The charge originates from the voltage source and raises the voltage over the output port. The required energy is taken from the work done against the electrostatic damping force. As the storage capacitor continuously discharges through the output load, equilibrium is reached after a certain time. In the present example (FIG. 13) the output voltage saturates at about 11 V.

Figure 11:
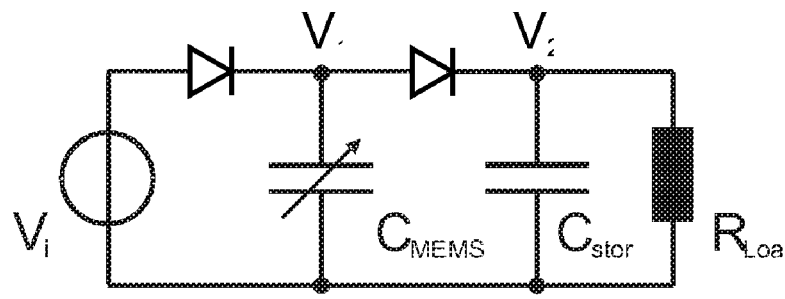
FIG. 11 shows an electrical harvesting circuit using diodes instead of active switches.

An alternative approach for the proposed circuit is shown in FIG. 11. Here the active switches have been replaced by diodes as passive switches. These diodes allow charge, respectively current, to flow into the MEMS-capacitor if the input voltage is higher than the actual voltage over the variable capacitor plus the voltage drop over the diode (typically 0.6 V). If the voltage over the MEMS-capacitor increases (due to displacement of the movable electrode) the left diode blocks. If V1 is larger than V2 the charge is shared with the storage capacitor, thus increasing the output voltage. This approach is less efficient than the one shown in FIG. 10 but does not require active switching.

Figure 14:
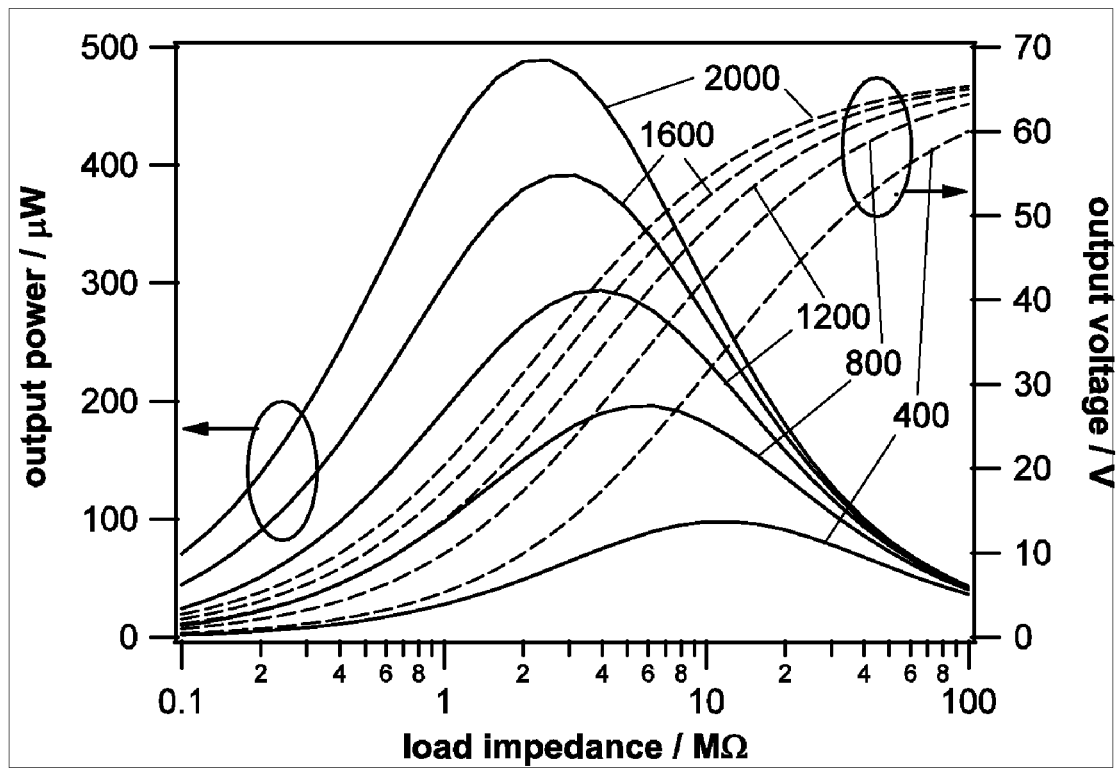
FIG. 14 shows the steady state output power and output voltage for various excitation frequencies as a function of the load impedance.

It is possible to determine the output voltage and the output power in steady-state condition, as a function of the load impedance. The results of such a calculation are shown in FIG. 14. The maximum power is given for different operating frequencies (400 Hz, 800 Hz, 1200 Hz, 1600 Hz and 2000 Hz). The optimum load varies from 2 MΩ to 10 MΩ. The numbers result from feasible design parameters for a structure of 1×1 cm² footprint, a structural height of 100 μm and an envisaged minimum gap spacing of 100 nm. The design can be adjusted to satisfy certain limits, e.g. maximum allowable voltage.

Figure 15:
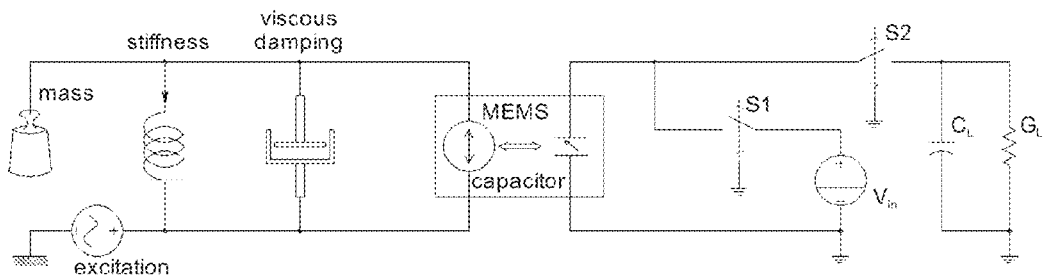
FIG. 15 is a schematic representation of the simplified behavioral model of an electrostatic scavenger. The mechanical domain is represented by a damped spring-mass system. A variable capacitor couples the mechanical dynamics with an electrical circuit.
Figure 16A:
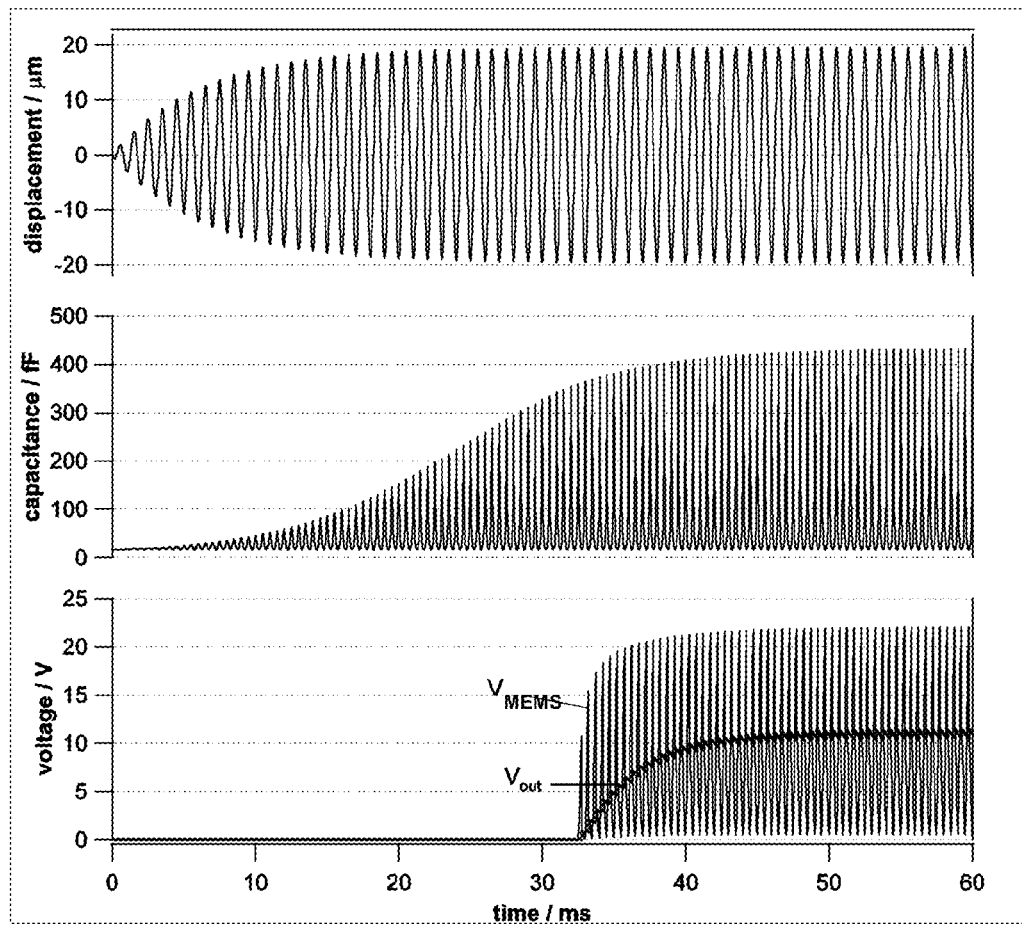
FIG. 16(a) shows the varying displacement of the mass (top), the resulting variable capacitance (middle) and the variable voltages $V_M$ and $V_{out}$ (bottom).
Figure 16B:
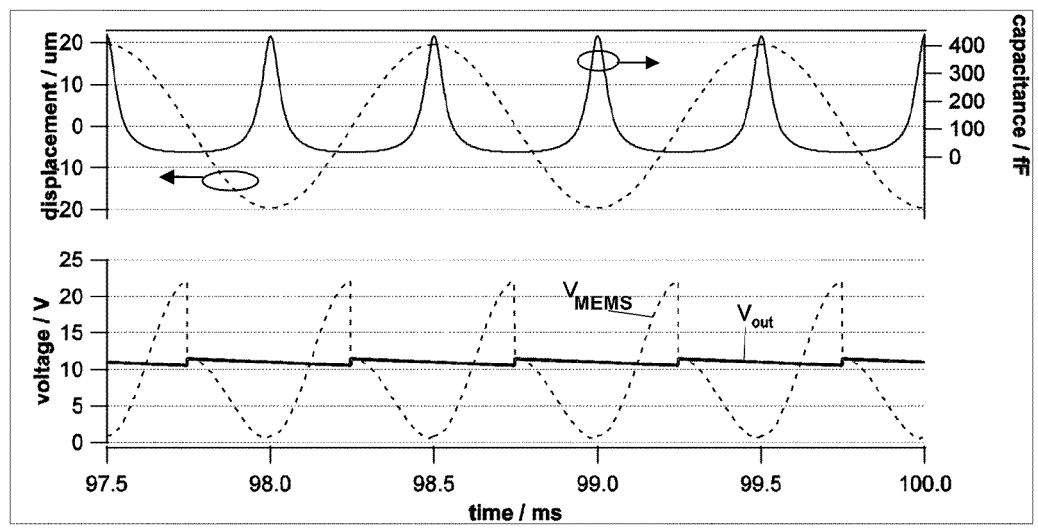
FIG. 16(b) shows the same data over a shorter period of time.

The approach used to perform a physically correct dynamic simulation of the structure considers the mechanical dynamics (mass, spring, damper) as well as the electrical circuit. The interaction between these two domains is achieved by using the mass displacement, as calculated in the mechanical model, as a parameter to determine the actual capacitance for the electrical circuit model. From the charge, as determined in the circuit model, one can derive the electrostatic force acting in the mechanical part of the model. A simplified schematic of this model is shown in FIG. 15. The mechanical domain is represented by a damped spring-mass system. A variable capacitor couples the mechanical dynamics with the electrical circuit. FIG. 16 shows corresponding simulation results, as obtained by SABER. FIG. 16(a) shows the varying displacement of the mass (top), the resulting variable capacitance $C_{MEMS}$ (middle), and the varying capacitor voltage $V_{MEMS}$ and output voltage $V_{out}$ (bottom). It can be concluded that from a rest position a stable harmonic motion is developed. The variable capacitance also increases its maximum, resulting in a saturation of the output voltage at about 11 V. FIG. 16(b) shows the same data over a shorter period. The power for charging the variable capacitor is drawn from the source. In the present case this is negligible compared to the power dissipated in the load resistor. In the present example 207 μW are continuously dissipated in the load while the source provides 18.7 μW. These power values result from an electromechanical simulation of the model shown in FIG. 15. The main parameters used are f=1 kHz, $C_{min}$=0.885 nF, $C_{max}$=21.7 nF, $V_{in}$=1V, $C_L$=10 nF, $R_L$=590 kOhm.

The resonance frequency of an electrostatic energy converter of the present embodiment can advantageously be tuned, e.g. by providing tuning actuators based on a comb structure with a varying, e.g. linearly varying, finger length. As e.g. described by D. Scheibner et al in "A frequency selective silicon vibration sensor with direct electrostatic stiffness modulation", Analog Integrated Circuits and Signal Processing, 37, pp 35-43, 2003, such comb structures with linearly varying finger length can be used for applying electrostatic forces to a seismic mass. The forces lead to a softening of the system and therewith to a lowering of the resonance frequency. To achieve linear characteristics the second derivative of the capacitance function is preferably constant over the amplitude range (such that the resonance frequency is independent on the vibration amplitude). It is an advantage of an electrostatic energy converter of some embodiments that these tuning actuators can be vertically integrated with the mass of the energy converter. It is an advantage of such vertical integration that a plurality of tuning actuators can be provided such that a good tuning efficiency can be obtained, the tuning efficiency being defined as the shift in resonance frequency as a function of a tuning voltage applied to the tuning actuator. By applying a tuning voltage to the tuning actuator, an electrostatic force is generated and applied to the seismic mass. The electrostatic force, which causes a frequency shift, is proportional to the actuator size and to the square of the actuation voltage. Therefore, by providing more tuning actuators a larger force can be applied and thus a larger frequency shift can be obtained.

Figure 5I:
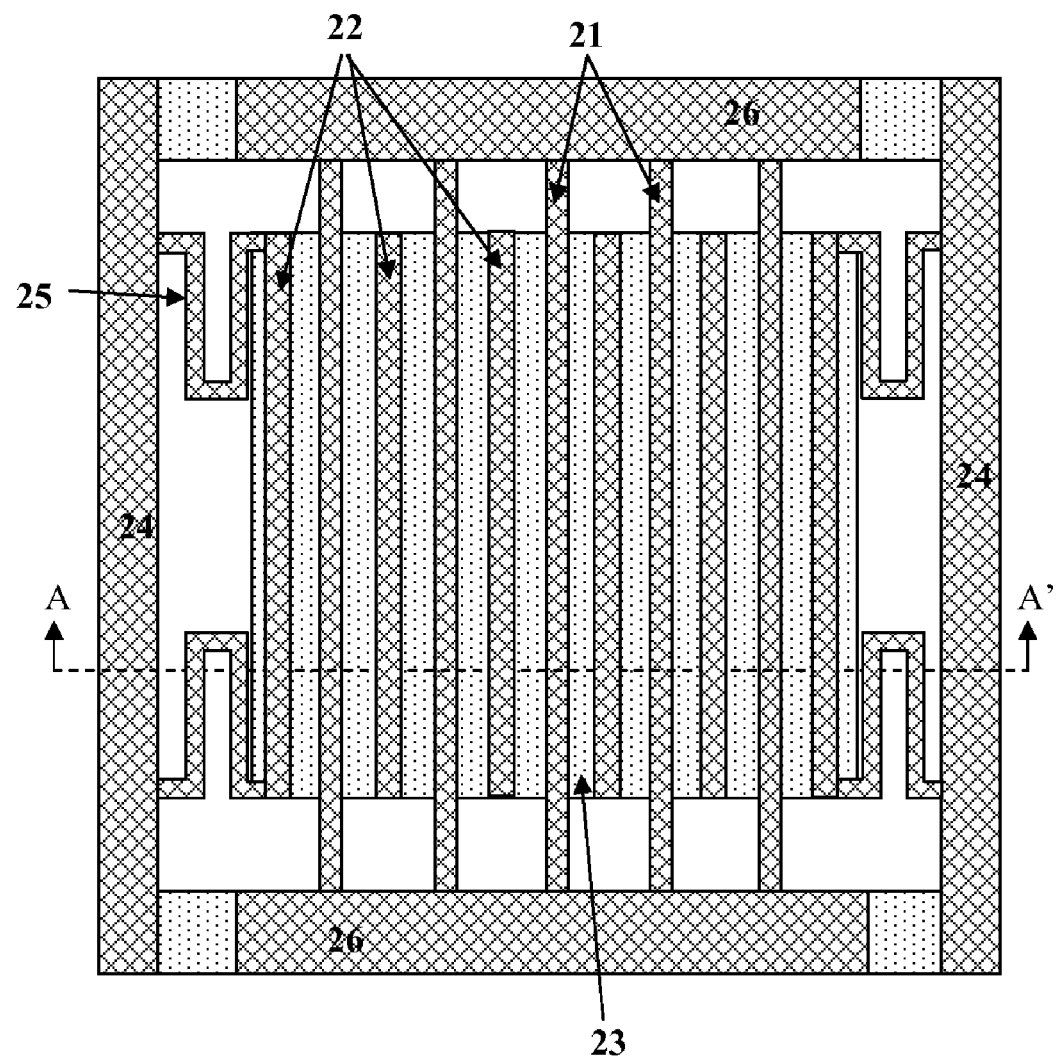
Figure 5I:
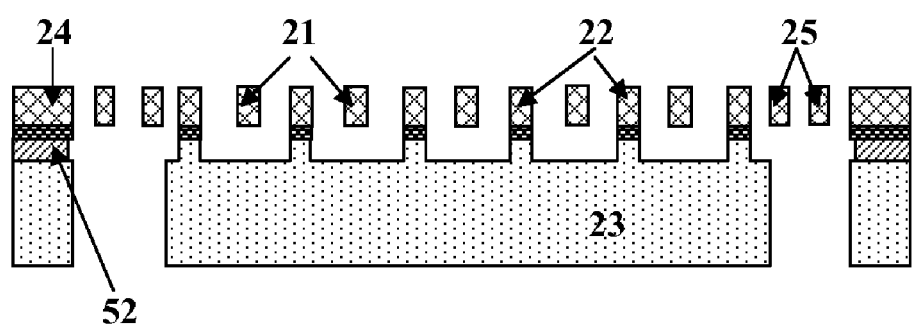
Figure 17:
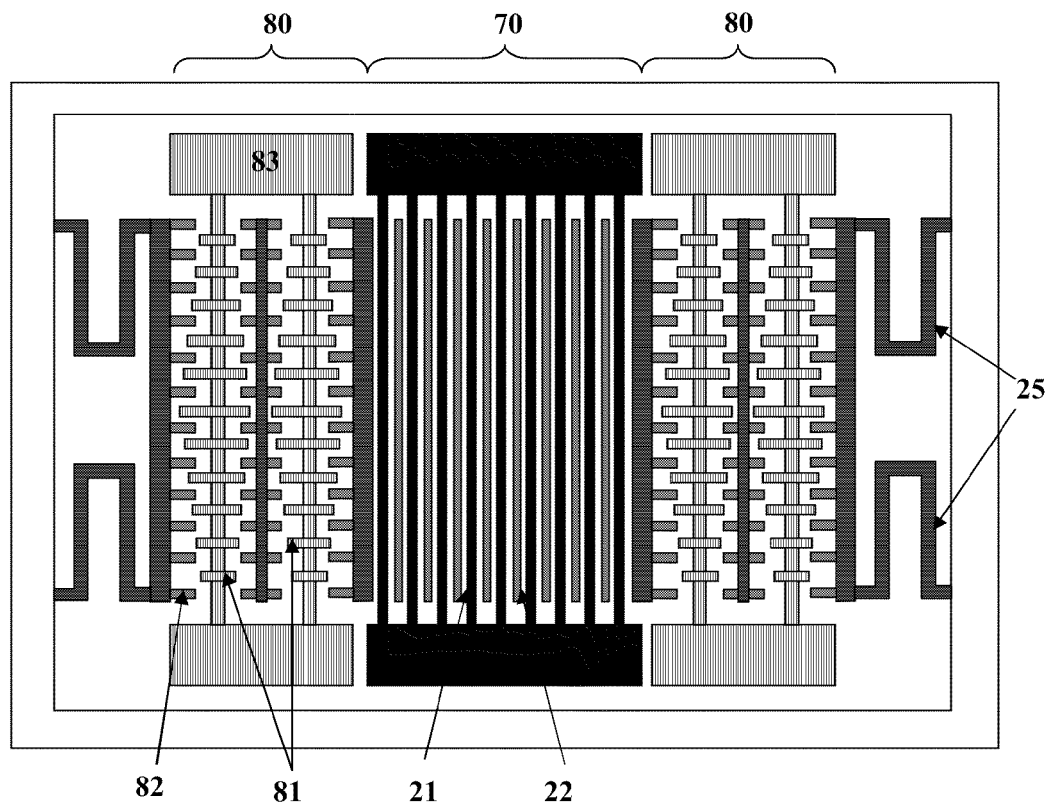
FIG. 17 schematically illustrates an electrostatic scavenger according to a present embodiment with integrated actuators for frequency tuning.

FIG. 17 schematically illustrates an electrostatic energy converter with four tuning actuators 80. In FIG. 17 the seismic mass 23 is not shown. In some embodiments the seismic mass 23 is vertically integrated with the electrodes of the scavenging part 70 and it is vertically integrated with the electrodes of the tuning actuators 80. Integration of the seismic mass 23 may be realized in different ways, e.g. as illustrated in FIG. 4(l) or as illustrated in FIG. 5(i).

As shown in FIG. 17, the tuning actuators 80 have a comb structure, comprising fixed tuning fingers 81 and movable tuning fingers 82, the movable tuning fingers 82 being movable relative to the fixed tuning fingers 81. The fixed tuning fingers 81 are physically attached to fixation structures 83 on a (vibrating) frame whereas the movable tuning fingers 82 are physically connected to the seismic mass 23 or connection means (not shown). As described above, also the movable fingers 22 of the scavenging part 70 are physically connected to the seismic mass 23 or connection means 28. For the tuning actuators 80, a suitable electrode design is chosen that results in a capacitance which changes quadratically with displacement. As the stiffness is defined as the second spatial derivative of the electrical energy stored in the capacitor, the quadratic characteristic results in a constant stiffness value, independent of the actual displacement of the mass. Therefore, as can be seen in FIG. 17, the fixed tuning fingers 81 have a linearly varying length. The mechanical stiffness of the suspension is thus electrically modified by a tuning voltage which biases the electrostatic tuning actuator. The tuning voltage is applied between the fixed tuning fingers 81 and the movable tuning fingers 82. The capacitance between the plurality of fixed tuning fingers and the plurality of movable tuning fingers depends on the displacement of the seismic mass 23. This capacitance changes quadratically with the mass displacement. This leads to an effect called spring softening as the electrostatic force now depends linearly on the displacement. Together with the mechanical restoring force from the suspension a smaller effective stiffness is achieved. This leads to a smaller resonance frequency. This tuning scheme can advantageously be used for tuning the resonance frequency of an electrostatic harvester of some of the embodiments.

The setup of the electrostatic scavenger of some of the embodiments, which includes a mass which is vertically integrated with electrodes, allows the integration of multiple tuning actuators 80 below the mass. In this way, more tuning actuators can be integrated, leading to a higher tuning efficiency as compared to planar devices.

Figure 18:
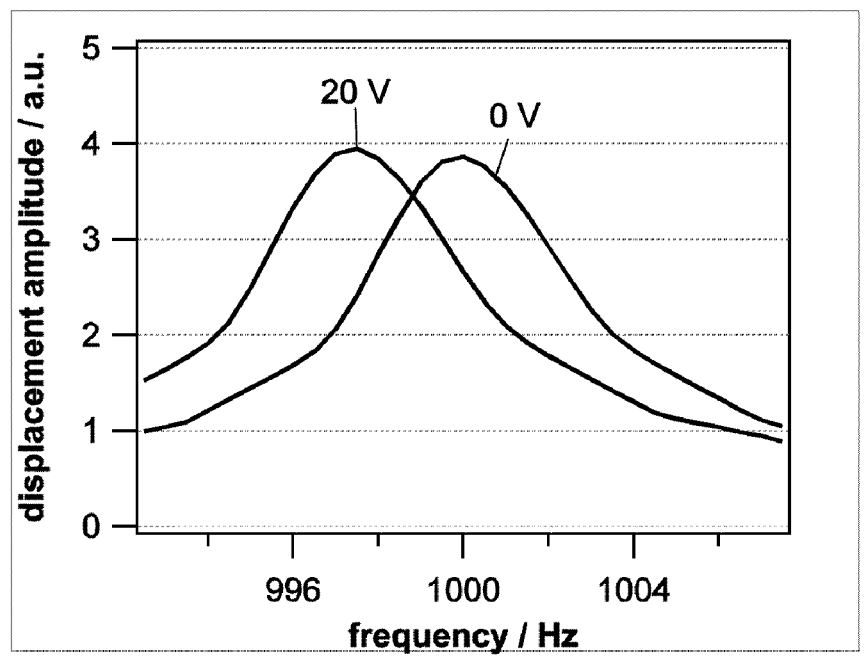
FIG. 18 shows the mass displacement magnitude as a function of the frequency for an electrostatic scavenger according to the present embodiment, without frequency tuning (curve 'OV') and with frequency tuning (curve '20 V').

FIG. 18 shows the displacement magnitude under external vibration of a mass of an electrostatic scavenger as a function of the excitation frequency. The maximum displacement corresponds to mechanical resonance. The frequency at which maximum displacement is achieved is the resonance frequency. FIG. 18 shows a curve ('0V') for a scavenger without tuning (i.e. tuning voltage=0 V) and a curve ('20 V') for a tuned scavenger (tuning voltage=20 V). Under presence of a voltage across the tuning electrodes a negative electrostatic stiffness is induced. This leads to a lower effective stiffness for the system, and thus a decrease of the resonance frequency.

Calculations of the frequency shift were performed for a scavenger with seismic mass dimensions of 5 mm×5 mm×0.675 mm and a mass of 40 mg, 5 micrometer gap for the tuning actuator, 20 actuators in total and a tuning voltage of 20V. Table 1 shows the results of these calculations.

| Frequency [Hz] | Relative shift [%] | Absolute shift [Hz] |
|---|---|---|
| 250 | 4.07 | 10.2 |
| 500 | 1.0 | 5.01 |
| 750 | 0.44 | 3.33 |
| 1000 | 0.25 | 2.49 |

Figure 19:
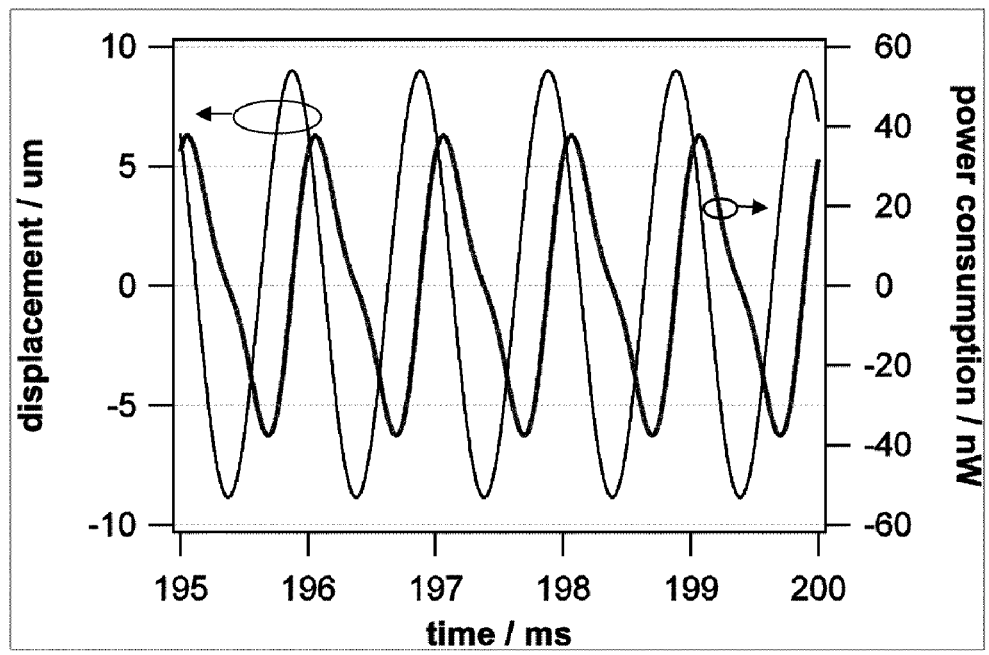
FIG. 19 shows mass displacement and power consumption of the tuning actuator over time.

FIG. 19 shows the displacement of a mass of an electrostatic scavenger of an embodiment under resonance. In the example shown, a tuning actuator is provided and biased with a voltage of 20 V. The tuning power can be calculated as the voltage over the tuning capacitor (20 V) times the charge/discharge current flowing through the tuning capacitor. The resulting tuning power is shown in FIG. 19. The net power consumption for tuning can be determined by averaging the tuning power over one period. In the example shown the net power consumption is nearly zero.

In the detailed description, numerous specific details have been set forth in order to provide a thorough understanding of the particular embodiments and how they may be practiced. However it will be understood that the present embodiments may be practiced without these specific details. In other instances, well-known methods, procedures and techniques have not been described in detail, so as not to obscure the present embodiment. While the present embodiments are described with respect to with reference to certain drawings, the reference is not limited hereto. The drawings included and described herein are schematic and are not limiting. It is also noted that in the drawings, the size of some elements may be exaggerated and, therefore, not drawn to scale for illustrative purposes.

Furthermore, the terms first, second and the like in the description are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein. In addition to the disclosed embodiments, numerous other embodiments and configurations are possible and within the scope of the claims.

Moreover, the terms top, bottom, over, under and the like in the description are used for descriptive purposes and not necessarily for describing relative positions. It is to be understood that the terms so used are interchangeable under appropriate circumstances and that the embodiments described herein are capable of operation in other orientations than described or illustrated herein.

It is to be noticed that the term "comprising" should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B.

The invention claimed is:

1. A microstructure comprising: a substrate; a fixed electrode having a plurality of fixed fingers fixed to the substrate; and a movable electrode having a body and a plurality of fingers extending from the body, the movable electrode being movable relative to the fixed fingers to vary a capacitance of the electrodes, wherein the plurality of fixed fingers (i) extends in a plane parallel to a main surface of the substrate and (ii) is suspended between fixation structures anchored to the substrate, and the body of the movable electrode is vertically aligned to the plurality of fingers such that the body is located outside the plane.

2. The microstructure according to claim 1, wherein the plurality of fixed fingers extends from an edge of the microstructure to an opposite edge of the microstructure.

3. The microstructure according to claim 1, wherein the fixed fingers and the fingers of the movable electrode are interdigitated.

4. The microstructure according to claim 1, the body comprising a seismic mass.

5. The microstructure according to claim 1, further comprising means for tuning a resonance frequency of the microstructure.

6. The microstructure according to claim 5, the means for tuning the resonance frequency comprising at least one electrostatic tuning actuator.

7. The microstructure according to claim 6, the at least one electrostatic tuning actuator comprising a plurality of movable tuning fingers and a plurality of fixed tuning fingers, the plurality of fixed tuning fingers having a linearly varying length, the plurality of movable tuning fingers and the plurality of fixed tuning fingers being interdigitated.

8. The microstructure according to claim 5, wherein the means for tuning the resonance frequency is vertically connected to the body such that the means may be located in the plane.

9. An electrostatic scavenger comprising: a substrate; a fixed electrode having a plurality of fixed fingers fixed to the substrate; and a movable electrode having a body and a plurality of fingers extending from the body, the movable electrode being movable relative to the fixed fingers to vary a capacitance of the electrodes, wherein the plurality of fixed fingers (i) extends in a plane parallel to a main surface of the substrate and (ii) is suspended between fixation structures anchored to the substrate, and the body of the movable electrode is vertically aligned to the plurality of fingers such that the body is located outside the plane.

* * * * *